US011924965B2

(12) United States Patent
Chang et al.

(10) Patent No.: US 11,924,965 B2
(45) Date of Patent: Mar. 5, 2024

(54) PACKAGE COMPONENT AND FORMING METHOD THEREOF

(71) Applicant: TAIWAN SEMICONDUCTOR MANUFACTURING COMPANY LTD., Hsinchu (TW)

(72) Inventors: Chun-Wei Chang, Taoyuan County (TW); Jian-Hong Lin, Yunlin (TW); Shu-Yuan Ku, Taipei County (TW); Wei-Cheng Liu, Hsinchu County (TW); Yinlung Lu, Hsinchu (TW); Jun He, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/728,758

(22) Filed: Apr. 25, 2022

(65) Prior Publication Data
US 2023/0345622 A1    Oct. 26, 2023

(51) Int. Cl.
*H05K 1/11*    (2006.01)
*H05K 1/02*    (2006.01)
*H05K 3/42*    (2006.01)

(52) U.S. Cl.
CPC ......... *H05K 1/0242* (2013.01); *H05K 1/0251* (2013.01); *H05K 1/116* (2013.01); *H05K 3/427* (2013.01); *H05K 3/429* (2013.01); *H05K 2201/0776* (2013.01)

(58) Field of Classification Search
CPC ........ H05K 1/112; H05K 1/113; H05K 1/114; H05K 1/115; H05K 1/116
See application file for complete search history.

(56) References Cited

U.S. PATENT DOCUMENTS

2012/0044025 A1*   2/2012   Nakamura ........... H03H 9/1021
                                                 29/829

OTHER PUBLICATIONS

"Substrate Materials," Web page <https://incoseil.org/check_download_nopass.php?forcedownload=1&file=Substrate__Materials.pdf&no_encrypt=true&dlpassword=18520>, 66 pages, created on Jan. 24, 2018, and retrieved from Internet between Aug. 2021 and Oct. 2021.
"Using a Laser Microscope to Measure Beyond Rz (Maximum Height) Roughness," Web page <https://www.olympus-ims.com/zh/applications/copper-foil-surface-roughness-for-5g-printed-circuit-boards/>, 1 page, published on Aug. 1, 2017, and retrieved from Internet between Aug. 2021 and Oct. 2021.
D. Sarkar et al., "High-Frequency Behavior of Graphene-Based Interconnects—Part II: Impedance Analysis and Implications for Inductor Design", IEEE Transactions on Electron Devices, 58, pp. 853-859, 2011 (https://doi.org/10.1109/TED.2010.2102035).

(Continued)

*Primary Examiner* — Jeremy C Norris
(74) *Attorney, Agent, or Firm* — WPAT LAW; Anthony King

(57) ABSTRACT

A package component and forming method thereof are provided. The package component includes a substrate and a conductive layer. The substrate includes a first surface. The conductive layer is disposed over the first surface. The conductive layer includes a first conductive feature and a second conductive feature. The second conductive feature covers a portion of the first conductive feature. A resistance of the second conductive feature is lower than a resistance of the first conductive feature.

20 Claims, 23 Drawing Sheets

(56) References Cited

OTHER PUBLICATIONS

R. Mehta et al., "Enhanced Electrical and Thermal Conduction in Graphene-Encapsulated Copper Nanowires", Nano Lett. 2015, 15, 3, 2024-2030 (https://doi.org/10.1021/nl504889t).

Paul Garman, "Chemical Vapor Deposition of Silicon Oxycarbide Catalyzed Graphene Networks", Ohio State University, 2018. (http://rave.ohiolink.edu/etdc/view?acc_num=osu1523898208600691).

Lung-Hao Hu, "Thermal, Electrical and Optical Properties of Electrochemically Exfoliated Graphene on Flexible Substrate via Roll-to-Roll Fabrication", Journal of Southern Taiwan University of Science and Technology, Sep. 2017 (https://journal.stust.edu.tw/tc/news/33-14662).

S. Bae et al., "Roll-to-roll production of 30-inch graphene films for transparent electrodes", Nature Nanotech 5, 574-578 (2010). (https://doi.org/10.1038/nnano.2010.132).

P.V. Pham, "Graphene Etching: How Could it be Etched?", Current Graphene Science, vol. 2, pp. 15-20, 2018. (https://doi.org/10.2174/2452273202666180711103739).

"High-Frequency PCB Design Techniques," Web page <https://medium.com/@pcbonline.com/high-frequency-pcb-design-techniques-396373630cbe>, 1 page, published on Aug. 24, 2021, and retrieved from Internet between Aug. 2021 and Oct. 2021.

"What is High Frequency PCB," Web page <https://www.pcbway.com/blog/PCB_Basic_Information/What_is_High_Frequency_PCB.html>, 1 page, copyrighted on 2019, and retrieved from Internet between Aug. 2021 and Oct. 2021.

"The Importance of PCB Trace Widths in PCB Design," Web page <https://www.sfcircuits.com/pcb-school/pcb-trace-widths>, 1 page, retrieved from Internet Archive Wayback Machine <https://www.sfcircuits.com/pcb-school/pcb-trace-widths> on Aug. 4, 2020.

"Understanding PCB Via," Web page <https://www.teachmemicro.com/understanding-pcb-via/>, 1 page, published on Feb. 20, 2019, and retrieved from Internet between Aug. 2021 and Oct. 2021.

* cited by examiner

PACKAGE COMPONENT AND FORMING METHOD THEREOF

BACKGROUND

The semiconductor industry has experienced rapid growth due to ongoing improvements in the integration density of a variety of electronic components (e.g., transistors, diodes, resistors, capacitors, etc.). Such improvements in integration density have resulted from iterative reduction of minimum feature size, which allows more components to be integrated into a given area. As demand for shrinking electronic devices has grown, a need for smaller and more creative packaging techniques of semiconductor dies has emerged. A printed circuit board (PCB) serves to electrically connect electronic components thereto and mechanically fix them thereon.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 5A to 5L) are cross-sectional views illustrating a package component at different fabrication stages constructed according to aspects of one or more embodiments of the present disclosure.

DETAILED DESCRIPTION

Figure 1:
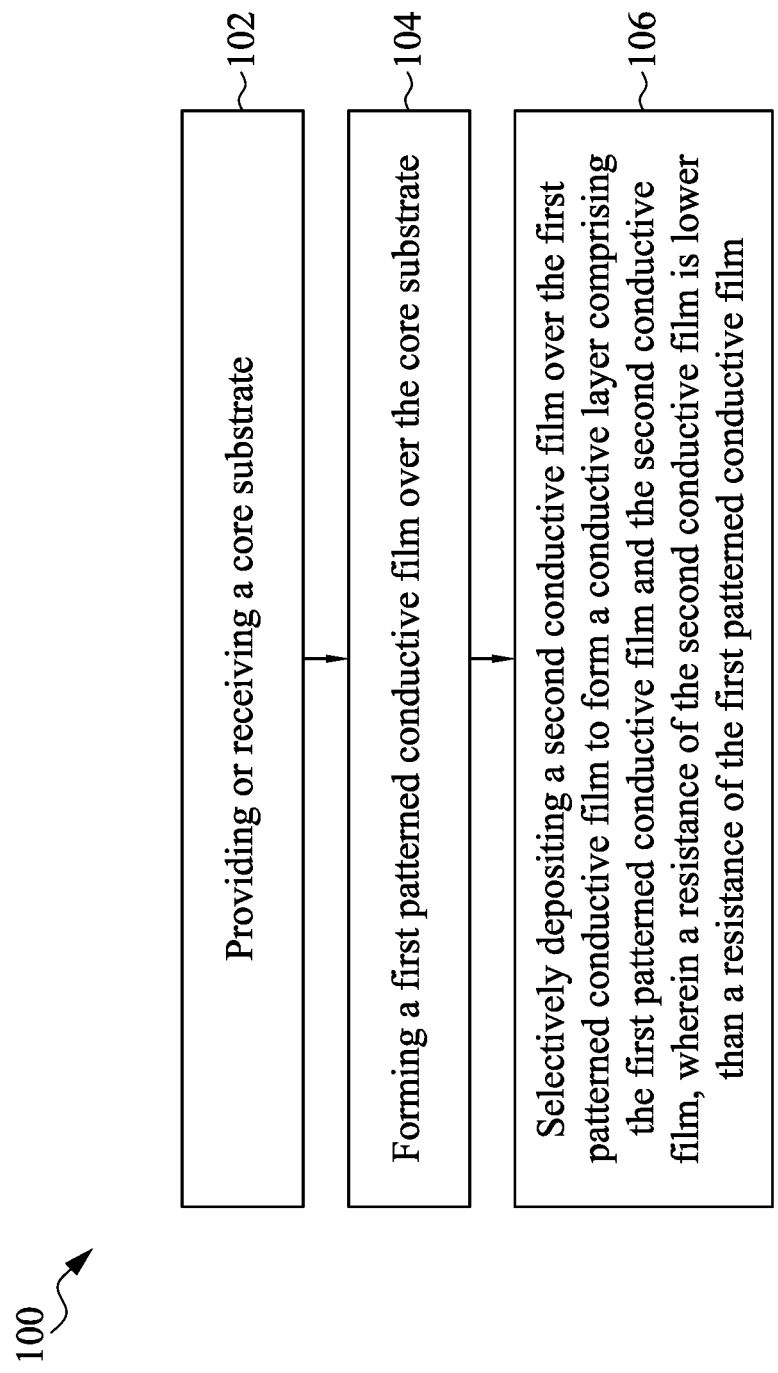
FIG. 1 is a flowchart representing a method for forming a package component according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A printed circuit board (PCB) serves to electrically connect electronic components to the PCB and mechanically fix the electronic components on the PCB. The PCB includes an insulator and a copper foil adhered to the insulator. One issue with higher frequencies of electrical signals used in PCBs is transmission loss. The transmission loss may be caused by a high resistance of a conductive material of a component (such as the copper foil in the PCB). For example, the electrical signal's higher frequency causes the electrical signal to be transmitted close to the copper foil's surface, leading to a type of conductor loss known as a skin effect. As an electrical current's frequency increases, most of the current flows close to the conductor's surface, resulting in the transmission loss. An approach to mitigate the transmission loss in the PCB is therefore of primary importance.

Some embodiments of the present disclosure provide a package component and a forming method thereof that provides one or more improvements over existing approaches. The present disclosure relates to a package component that includes a conductive layer having a conductive feature with a lower resistance. By forming the conductive layer as introduced below, a transmission loss may be reduced. In addition, the disclosed package component provides better conduction in high-frequency applications (e.g., greater than or substantially equal to 1 GHz). A performance of the package component may be thereby improved.

FIG. 1 is a flowchart representing a method 100 for forming a package component according to aspects of one or more embodiments of the present disclosure. The method 100 for forming the package component includes an operation 102, in which a substrate is provided or received. The method 100 further includes an operation 104, in which a first patterned conductive film is formed over the substrate. The method 100 further includes an operation 106, in which a second conductive film is selectively deposited over the first patterned conductive film to form a conductive layer. In some embodiments, the conductive layer includes the first patterned conductive film and the second conductive film. In some embodiments, a resistance of the second conductive film is lower than a resistance of the first patterned conductive film.

The method is described for a purpose of illustrating concepts of the present disclosure and the description is not intended to limit the present disclosure beyond what is explicitly recited in the claims. Additional operations can be provided before, during, and after the method described above and illustrated in FIG. 1, and some operations described can be replaced, eliminated, or moved around for additional embodiments of the method.

FIGS. 2A to 2K are cross-sectional views illustrating a package component 200 at different fabrication stages constructed according to aspects of one or more embodiments of the present disclosure.

Figure 2A:
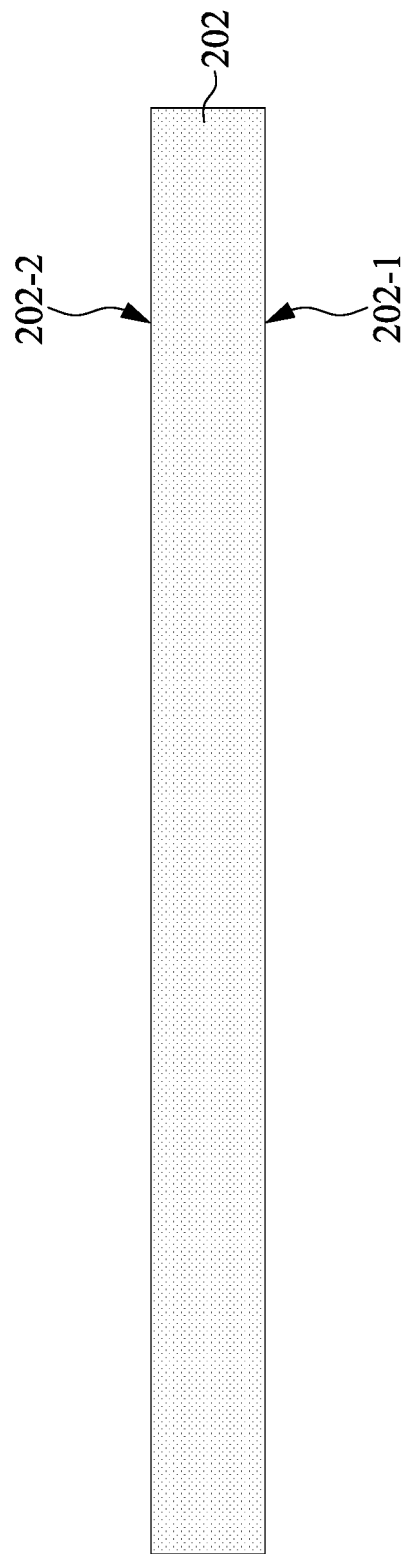
FIGS. 2A to 2K are cross-sectional views illustrating a package component at different fabrication stages constructed according to aspects of one or more embodiments of the present disclosure.

Referring to FIG. 2A, a substrate 202. (which is sometimes referred to as a core substrate) is provided or received. The respective step is shown as operation 102 of the method 100 in FIG. 1. The substrate 202 may be an insulating core and may include one or more layers of insulating materials. In some embodiments, the substrate 202 may include a material such as printed circuit board (PCB) material, fiberglass-reinforced resin material, build-up film such as Ajinomoto build-up film (ABF), pre-impregnated composite fiber (prepreg) material, epoxy, molding compound, epoxy molding compound, polymer material such as polytetrafluoroethylene (PTFE) or polyimide, paper, silica filler, glass fiber, non-woven glass fabric, glass, ceramic, other laminates, the like, or combinations thereof. The substrate 202 may be a double-sided copper-clad laminate (CCL) or the like. In alternative embodiments, the substrate 202 is a single-sided copper-clad laminate. The substrate 202 has a first surface 202-1 and a second surface 202-2 opposite to the first surface 207-1.

Figure 2B:
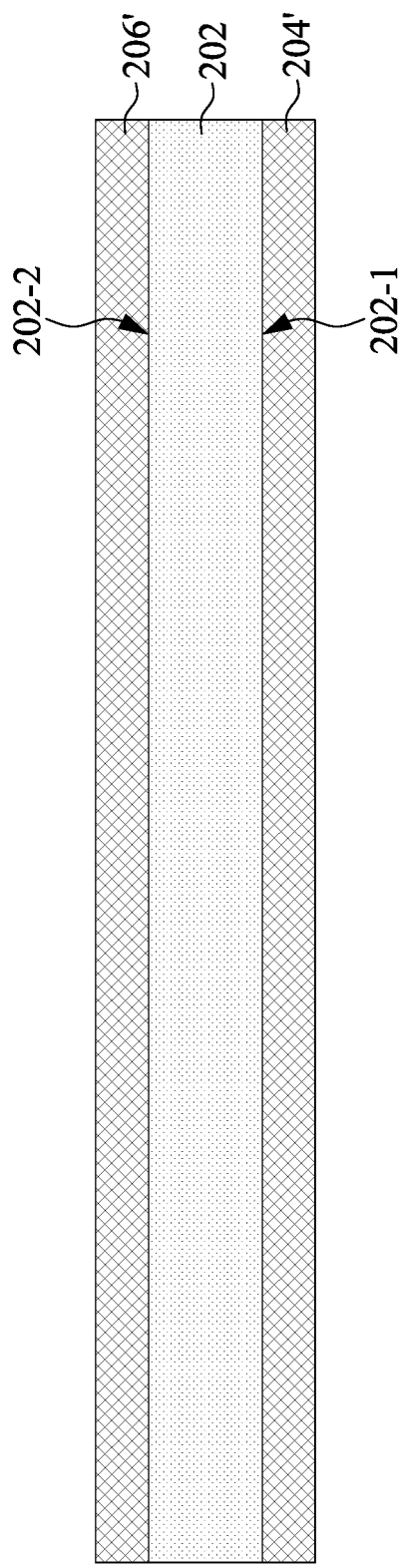
Figure 2C:
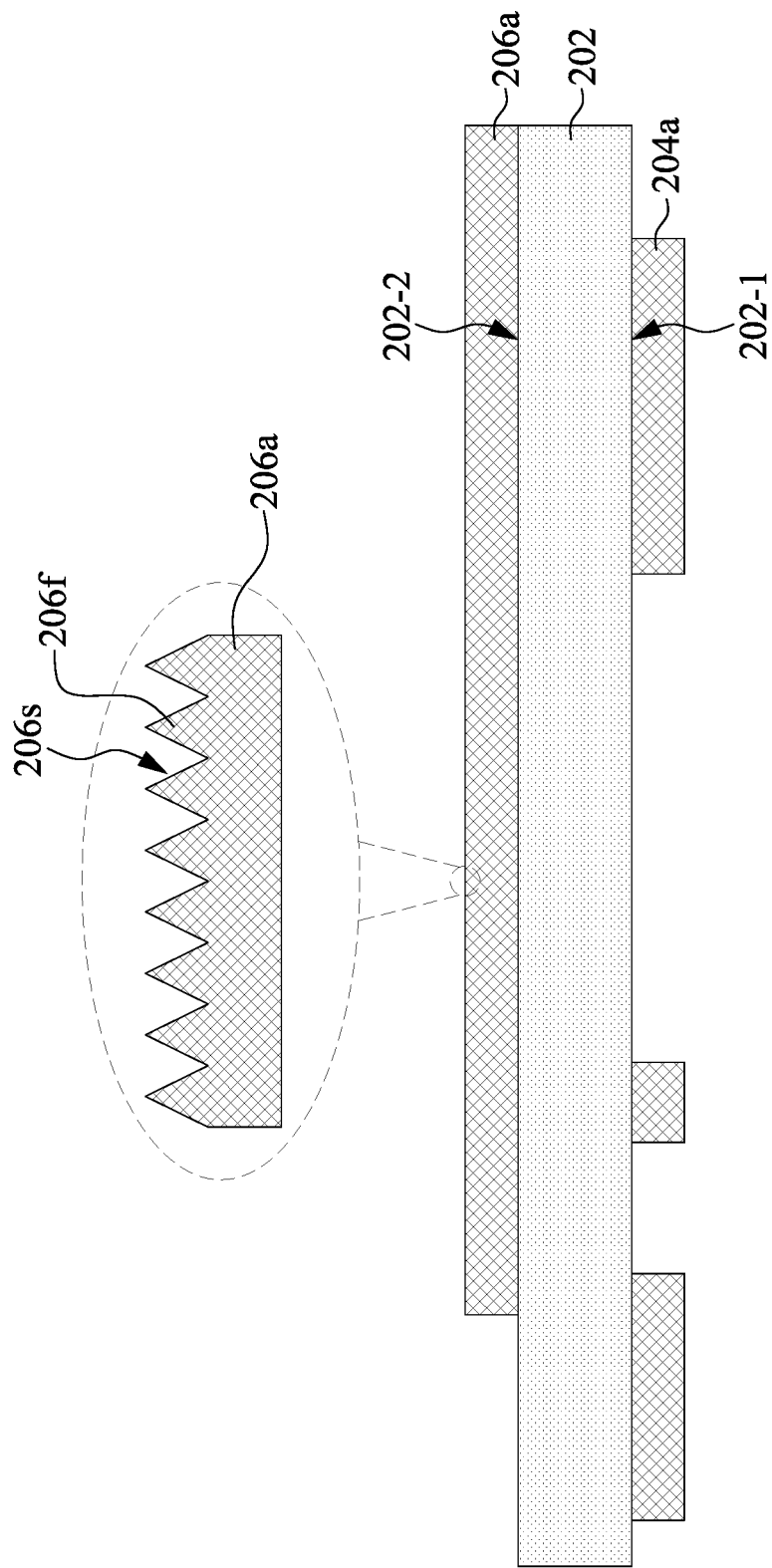

FIGS. 2B to 2C illustrate the formation of one or more patterned conductive films (also referred to as conductive features) 204a and 206a. The respective step is shown as operation 104 of the method 100 in FIG. 1. Referring to FIG. 2B, one or more conductive films 204' and 206' are formed over the substrate 202. The conductive films 204' and 206' may be formed onto opposing sides of the substrate 202. For example, the conductive film 204' is disposed over the first surface 202-1, while the conductive film 206' is disposed over the second surface 202-2.

The conductive films 204' and 206' may be formed using any suitable conductive materials and any suitable deposition processes (e.g., plating, electroless plating, or the like). The conductive films 204' and 206' may be one or more layers of copper (Cu), nickel (Ni), aluminum (Al), silver (Ag), gold (Au), cobalt (Co), ruthenium (Ru), palladium (Pd), titanium (Ti), other conductive materials, the like, or a combination thereof laminated or coated onto opposing sides of the substrate 202.

Referring to FIG. 2C, the conductive films 204' and 206' are respectively patterned to form the patterned conductive films 204a and 206a. The patterned conductive films 204a and 206a may be formed using any suitable lithographic materials (e.g., photoresist) and any suitable lithographic processes (e.g., wet chemical etch, or dry etch such as ashing). For example, the lithographic process may include $H_2O_2$ mixed with $FeCl_3$, HCl, $H_2SO_4$ or $HNO_3$. In some embodiments, one or more hard mask layers (not shown) are respectively formed over the conductive films 204' and 206'. The hard mask layers are then patterned through patterned photoresists (not shown) to form openings exposing portions of the conductive films 204' and 206', respectively. The exposed portions of the conductive films 204' and 206' are etched through the openings of the patterned hard mask layers, forming the patterned conductive films 204a and 206a.

The patterned conductive film 206a may include a roughed surface 206s. The patterned conductive film 206a further includes a plurality of fractions 206f forming the roughed surface 206s, as shown in an enlarged view of a portion of the patterned conductive film 206a shown in the dotted circle in FIG. 2C. In some embodiments, the fractions 206f have sharp and regular configurations. In alternative embodiments, the fractions 206f have rounded and/or irregular configurations. In some embodiments, the fractions 206f are pillar-like, irregular, micro-branch, or micro-bulge fractions. In some embodiments, the plurality of fractions 206f are not a designed structure in the manufacturing process, and a dimension of the plurality of fractions 206f is smaller than a dimension of the patterned conductive film 206a. The patterned conductive film 204a may also include a roughed surface similar to the roughed surface 206s of the patterned conductive film 206a.

Figure 2D:
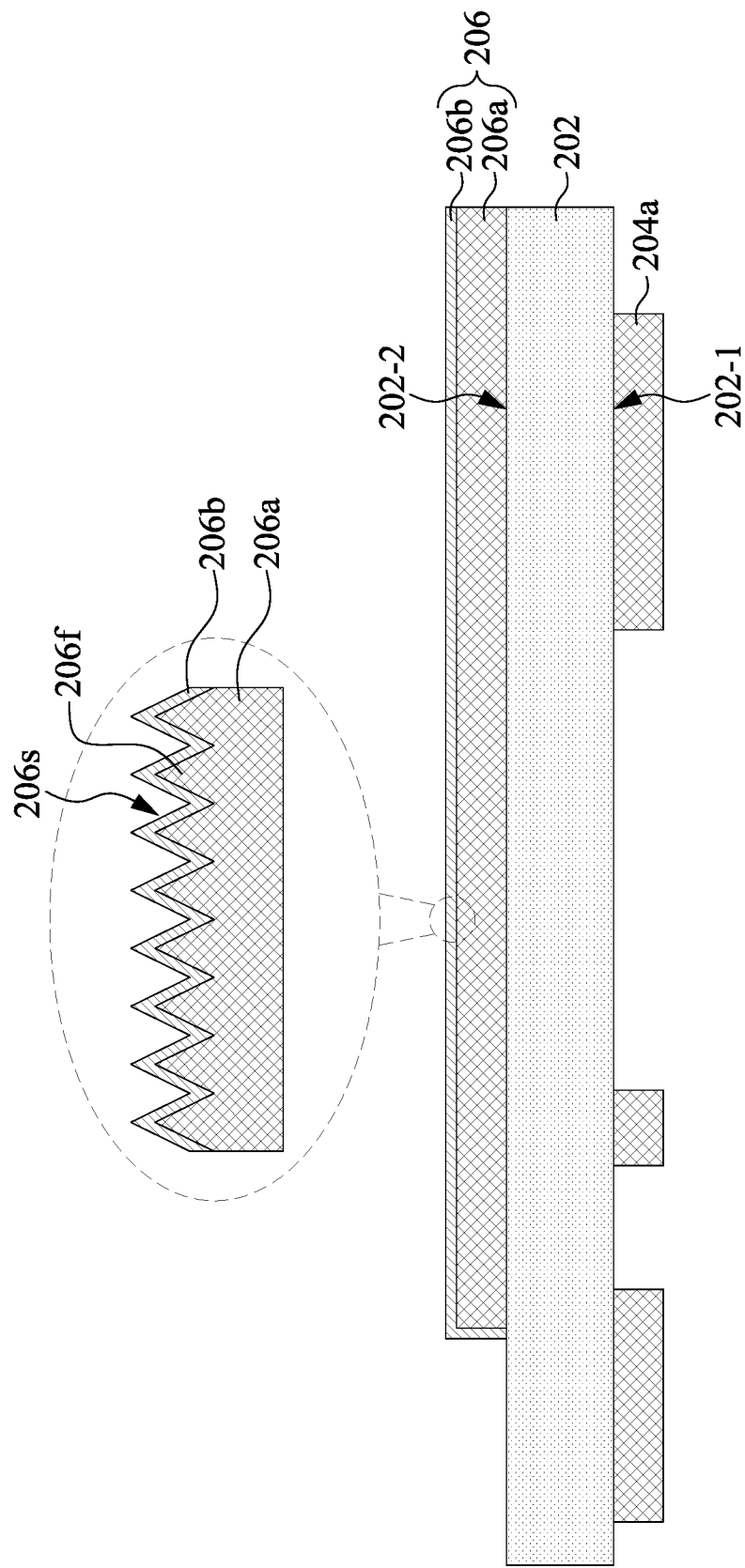

Referring to FIG. 2D, a conductive film 206b is selectively deposited over the patterned conductive film 206a to form a conductive layer 206 including the patterned conductive film 206a and the conductive film 206b. The respective step is shown as operation 106 of the method 100 in FIG. 1. In some embodiments, a resistance of the conductive film 206b is lower than a resistance of the patterned conductive film 206a. The conductive film 206b may be one or more layers of graphene, carbon nanotube (CNT), or other conductive materials. A number of the layers of graphene may be selected such that the resulting package component 200 can meet the requirements for enhancement of electrical and thermal conductivity in a high-frequency application. In some embodiments, the number of the layers of the conductive film 206b is substantially in a range from 1 to 20.

In some embodiments, the conductive film 206b is formed on the patterned conductive film 206a by an electroless plating process. For example, an electroless plating bath comprising copper ions is prepared, and graphene flakes may be dispersed in the electroless plating bath. In alternative embodiments, the conductive film 206b is selectively deposited on the patterned conductive film 206a by a chemical vapor deposition (CVD) process.

In some embodiments, an exposed surface of the patterned conductive film 206a may be entirely covered by the conductive film 206b. In other words, both an upper surface and sidewall surfaces of the patterned conductive film 206a are covered by the conductive film 206b. In some embodiments, the conductive film 206b covers a portion of the patterned conductive film 206a. In some embodiments, a coverage ratio of the conductive film 206b over the patterned conductive film 206a is substantially in a range from about 50% to about 100%. Alternatively, the coverage ratio may be substantially in a range from about 50% to about 80%. The conductive film 206b may partially cover the upper surface of the patterned conductive film 206a. For example, some portions of the patterned conductive film 206a may remain exposed and are not covered by the conductive film 206b.

In some embodiments, the conductive film 206b is substantially conformal with respect to a profile of the patterned conductive film 206a, as shown in an enlarged view of a portion of the patterned conductive film 206a shown in the dotted circle in FIG. 2D. In other words, the conductive film 206b is substantially conformal with respect to the roughed surface 206s of the patterned conductive film 206a. In some embodiments, a surface roughness (Ra) of the conductive layer 206 is substantially equal to a surface roughness of the patterned conductive film 206a.

The proposed method for forming the conductive layer 206 provides advantages. In some comparative embodiments where the conductive film 206b is absent, transmission loss may occur due to the roughened surface 206s of the patterned conductive film 206a and high resistance induced by the skin effect. The proposed method for forming the conductive layer 206 includes depositing the conductive film 206b having a lower resistance over the patterned conductive film 206a. The conductive film 206b may provide enhancement of electrical and thermal conductivity. Accordingly, the transmission loss may be reduced, and better conduction in high-frequency applications may be achieved.

Figure 2E:
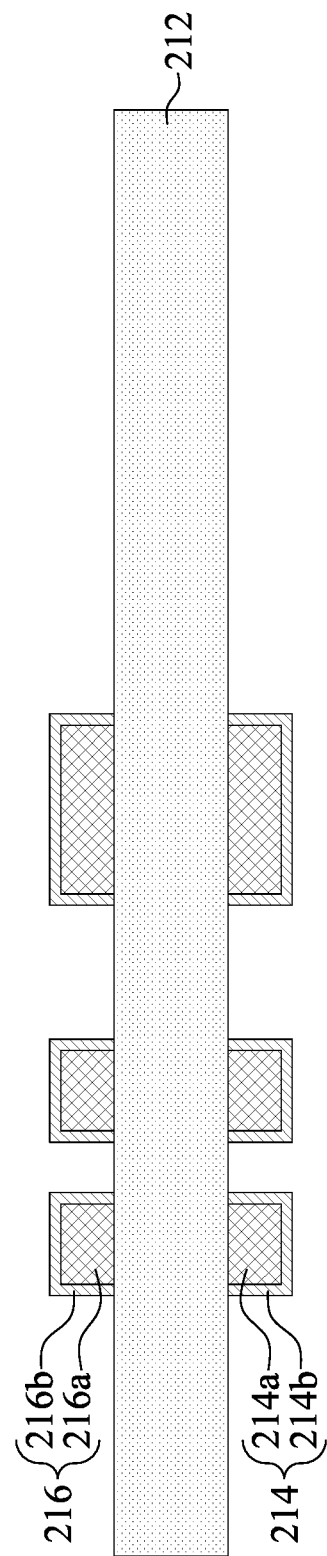
Figure 2F:
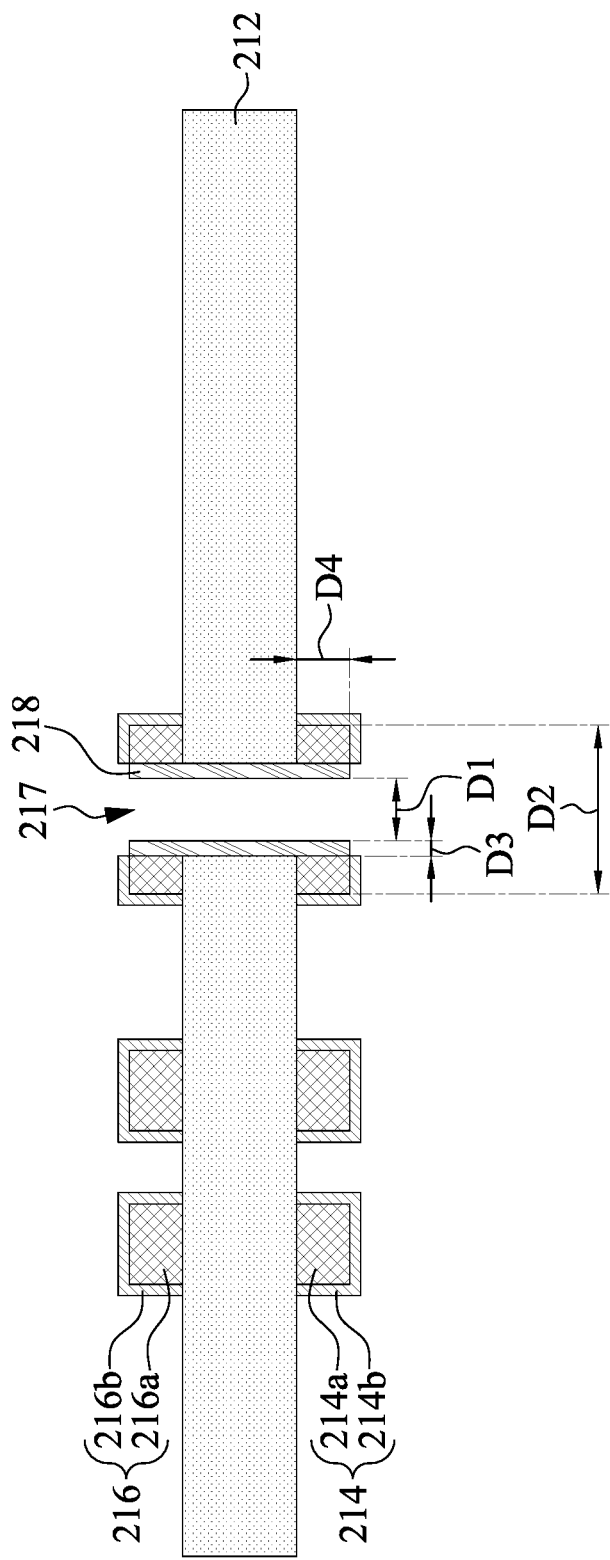

FIGS. 2E to 2F illustrate the formation of another substrate 212 and one or more conductive layers 214 and 216. Referring to FIG. 2E, operations similar to those described with reference to FIGS. 2A to 2D can be repeated for forming the substrate 212 and the conductive layers 214 and 216. The substrate 212 may include any suitable insulative materials that are suitable for forming the substrate 202, as set forth above. The conductive layers 214 and 216 may be formed using any suitable conductive materials and any suitable deposition processes that are suitable for forming the conductive layer 206, as set forth above.

The conductive layer 214 may include a conductive film 214a and a conductive film 214b. In some embodiments, a resistance of the conductive film 214b is lower than a resistance of the conductive film 214a. The conductive layer 216 may include a conductive film 216a and a conductive film 216b. In some embodiments, a resistance of the conductive film 216b is lower than a resistance of the conductive film 216a. Alternatively or additionally, a material of the conductive film 214a is same as a material of the conductive film 216a. In some embodiments, a material of the conductive film 214b is same as a material of the conductive film 216b.

Referring to FIG. 2F, one or more via openings 217 may be formed in the substrate 212. The via opening 217 may be formed using any suitable techniques of forming an opening in the substrate 212 (e.g., laser drilling, mechanical drilling, micro drilling, etching, or the like). Additionally, one or more via structures 218 may be formed in the via openings 217. The via structure 218 is located on and extends along a surface of the via opening 217. The via structure 218 extends through the substrate 212 to physically and electrically connect the conductive layers 214 and 216. The via structure 218 includes a conductive material. The conductive material comprises a metal (e.g., copper, titanium, tungsten, aluminum, alloys thereof, combinations thereof, or the like) and may be formed by plating (e.g., electroplating or electroless plating, or the like). In some embodiments, a material of the via structure 218 is same as the material of the conductive film 214a or the conductive film 216a.

In some embodiments, an upper surface of the via structure 218 is substantially coplanar with an upper surface of the conductive film 214a, In some embodiments, a bottom surface of the via structure 218 is substantially coplanar with a bottom surface of the conductive film 214b, Alternatively or additionally, the via structure 218 is separated from the conductive film 214b or 216b. In some alternative embodiments, the upper surface of the via structure 218 is substantially coplanar with an upper surface of the conductive film 214b. In some alternative embodiments, the bottom surface of the via structure 218 is substantially coplanar with a bottom surface of the conductive film 214b. Additionally, the via structure 218 may be in direct physical contact with a sidewall of the conductive film 214b or 216b.

In some embodiments, the via structure 218 has a hollow shape. In other words, the via structure 218 has an inner surface exposed to an environment. A via hole dimension D1 of the via structure 218 and a dimension D2 of the conductive film 214a are selected such that the resulting package component 200 can meet the requirements for accelerating data transmission and/or decreasing capacitance. In some embodiments, the via hole dimension D1 is less than or substantially equal to 0.2 mm (or 8 mil), and the dimension D2 is less than or substantially equal to 0.13 mm (or 5 mil). A ratio of the dimension D2 to the via hole dimension D1 is selected such that the resulting package component 200 can meet the requirements of high-frequency applications. In some embodiments, the ratio of the dimension D2 to the via hole dimension D1 is substantially in a range from about 0.15 to about 3.

A ratio of a thickness D3 of the via structure 218 to the via hole dimension D1 is selected such that the resulting package component 200 can meet the requirements of high-frequency applications. In some embodiments, the ratio of the thickness D3 to the via hole dimension D1 is substantially in a range from about 0.1 to about 0.25. A thickness D4 of the conductive film 214a is selected such that the resulting package component 200 can meet the requirements of high-frequency applications. In some embodiments, the thickness D4 is substantially in a range from about 0.0175 mm to about 0.035 mm. A ratio of the dimension D2 of the conductive film 214a to the thickness D4 of the conductive film 214a is selected such that the resulting package component 200 can meet the requirements of high-frequency applications. In some embodiments, the ratio of the dimension D2 to the thickness D4 is substantially in a range from about 0.5 to about 8.

In some alternative embodiments, after the forming of the via structure 218 along sidewalls of the via opening 217, the via opening 217 may then be filled with a dielectric through via core (not shown) using a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the dielectric through via core may include pigments or dyes (e.g., for color), or other fillers and additives that modify rheology, improve adhesion, or affect other properties of the dielectric through via core. The dielectric through via core may be formed using, e.g., a spin-on process or another process. In some embodiments, the conductive material for forming the via structure 218 may completely fill the via opening 217, omitting the dielectric through via core.

Figure 2G:
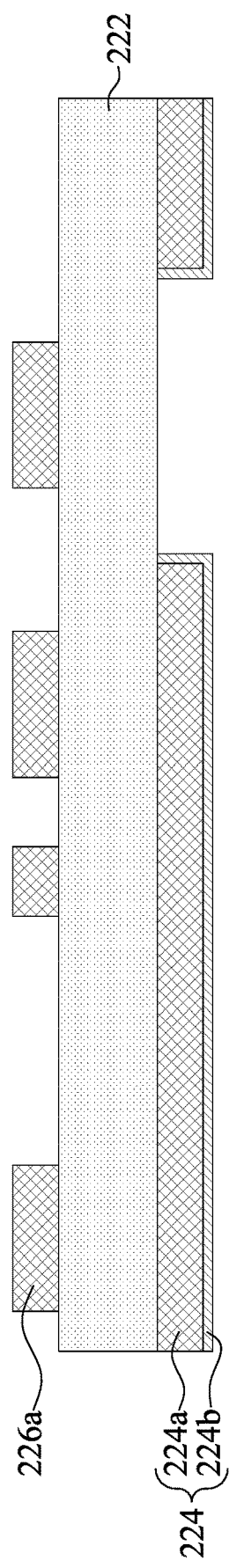

FIG. 2G illustrates the formation of another substrate 222, one or more conductive layers 224 and one or more conductive films 226a. Referring to FIG. 2G, operations similar to those described with reference to FIGS. 2A to 2D can be repeated for forming the substrate 222, the conductive layer 224 and the conductive film 226a. The substrate 222 may include any suitable insulative materials that are suitable for forming the substrate 202, as set forth above.

The conductive layer 224 and the conductive film 226a may respectively be formed using any suitable conductive materials and any suitable deposition processes that are suitable for forming the conductive layer 206 and the patterned conductive film 204a, as set forth above. The conductive layer 224 may include a patterned conductive film 224a and a conductive film 224b. In some embodiments, a resistance of the conductive film 224b is lower than a resistance of the patterned conductive film 224a. Alternatively or additionally, a material of the patterned conductive film 224a is same as a material of the conductive film 226a.

Figure 2H:
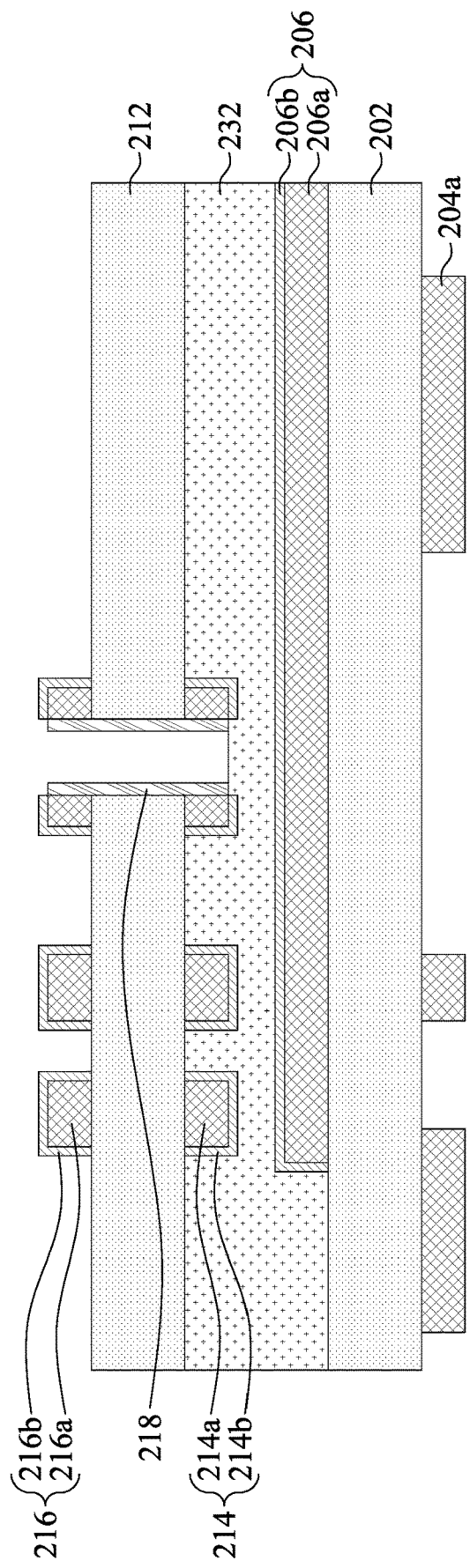

Referring to FIG. 2H, the substrate 212 is attached to the substrate 202. In some embodiments, the substrate 212 is attached to the substrate 202 by a dielectric layer 232. The dielectric layer 232 may include one or more layers of insulating materials. In some embodiments, the dielectric layer 232 may include glass fiber weave/cloth impregnated with a resin bonding agent. The dielectric layer 232 may be referred to as an encapsulant, a prepreg, an adhesive layer or a glue layer. In some embodiments, the dielectric layer 232 surrounds a lateral sidewall of the conductive film 206b or 214b. In some embodiments, the via structure 218 is electrically isolated from the conductive layer 206. The via structure 218 may be electrically isolated from the conductive layer 206 by the dielectric layer 232.

Figure 2I:
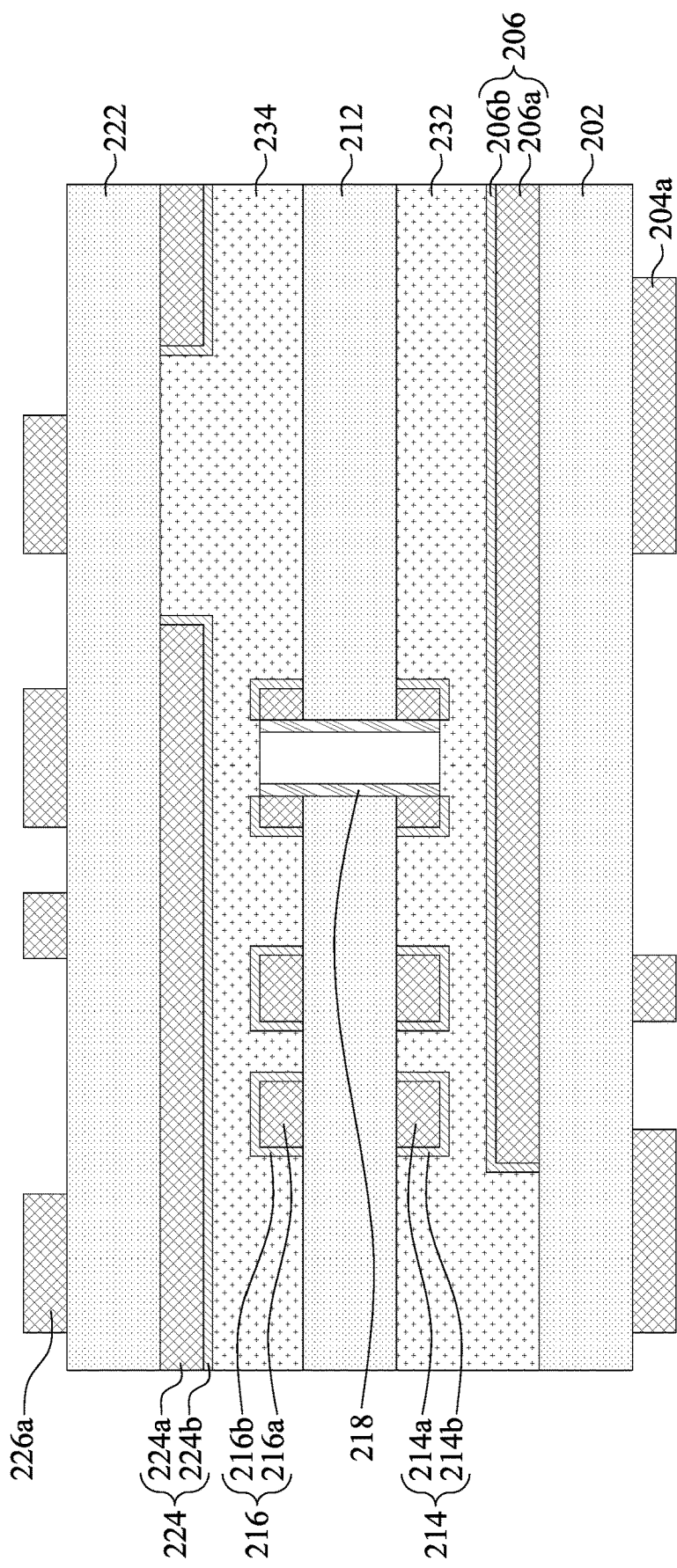

Referring to FIG. 2I, the substrate 222 is attached to the substrate 212. In some embodiments, the substrate 222 is attached to the substrate 212 by a dielectric layer 234. The dielectric layer 234 may include any suitable insulative materials that are suitable for forming the dielectric layer 232, as set forth above.

Figure 2J:
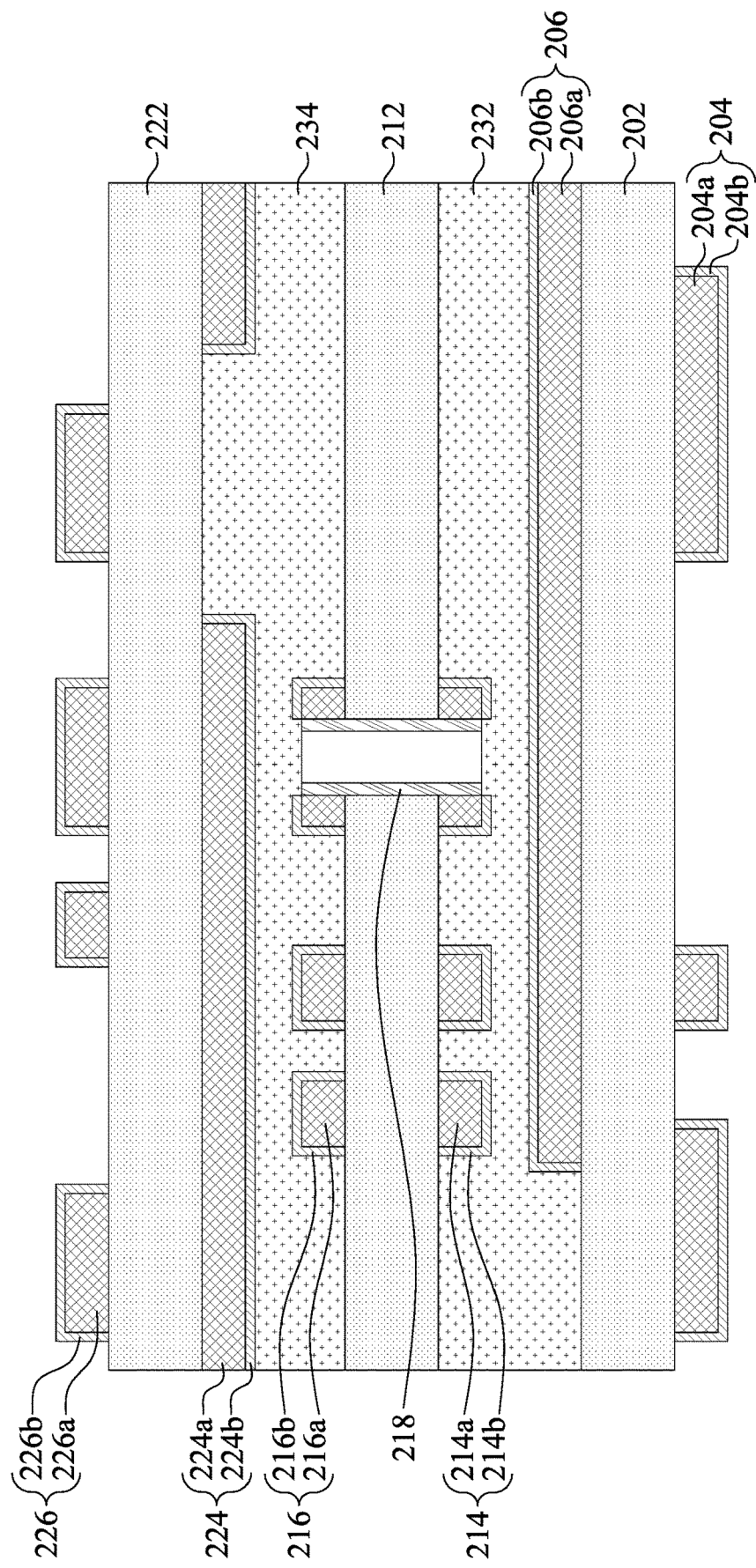

Referring to FIG. 2J, a conductive film 204b is deposited over the patterned conductive film 204a to form a conductive layer 204 including the patterned conductive film 204a and the conductive film 204b. Additionally, a conductive film 226b is deposited over the conductive film 226a to form a conductive layer 226 including the conductive film 226a and the conductive film 226b. In some embodiments, a resistance of the conductive film 204b is lower than a resistance of the patterned conductive film 204a. Alternatively or additionally, a resistance of the conductive film 226b is lower than a resistance of the conductive film 226a. The conductive films 204b and 226b may be formed using any suitable conductive materials and any suitable deposition processes that are suitable for forming the conductive film 206b, as set forth above.

Figure 2K:
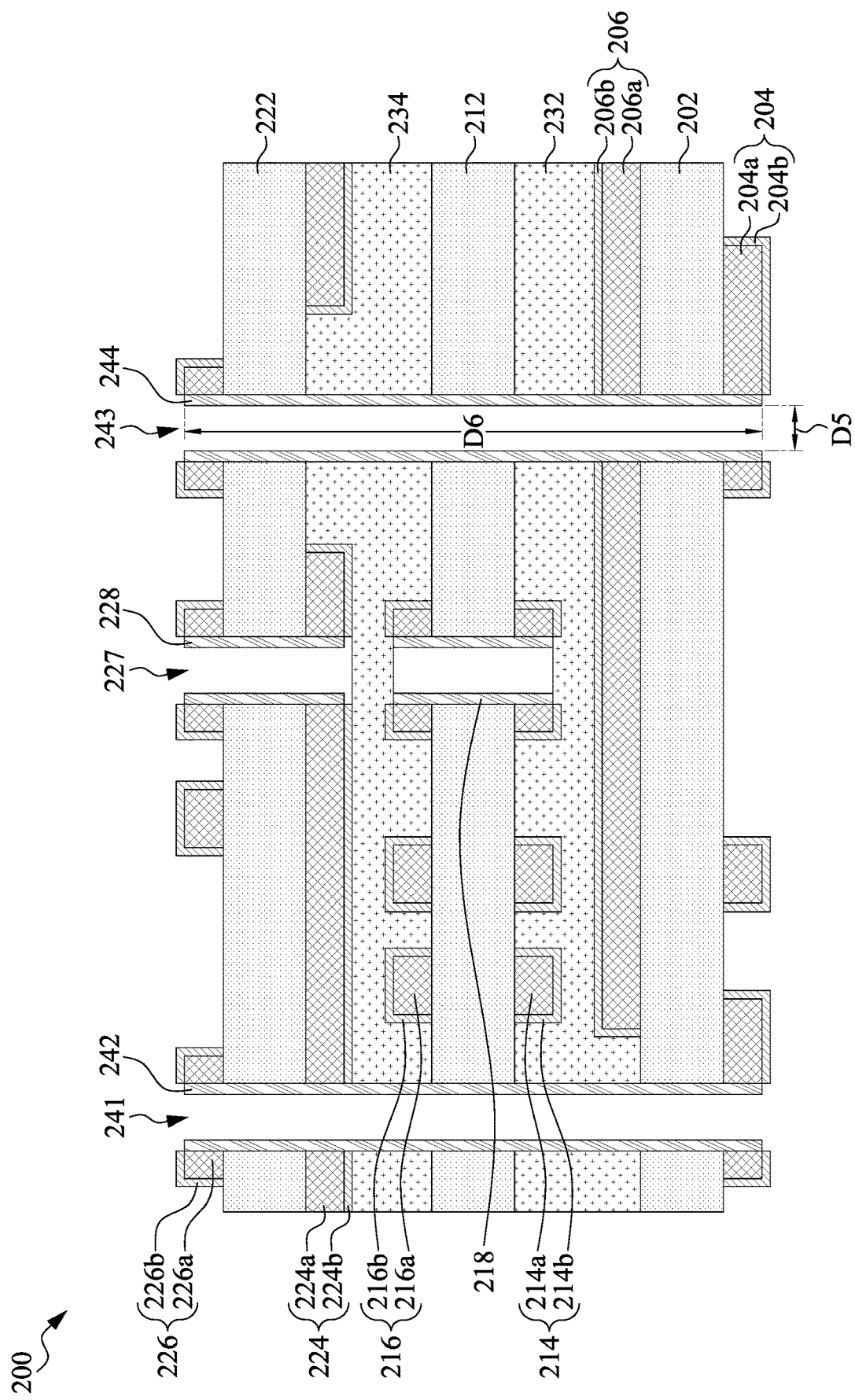

Referring to FIG. 2K, one or more through vias (also referred to as through via openings) 241 and 243 may be formed. The through vias 241 and 243 may penetrate through the substrates 202, 212 and 222. In some embodiments, the through vias 241 and 243 further penetrate through one or more conductive layers. For example, the through via 241 penetrates through the conductive layers 204, 224 and 226. Additionally, the through via 243 penetrates through the conductive layers 204 and 226. The through vias 241 and 243 may be formed using any suitable techniques of forming openings in the substrates 202, 212 and 222 (e.g., laser drilling, mechanical drilling, etching, or the like).

Additionally, one or more through via structures 242 and 244 may respectively be formed in the through vias 241 and 243, The through via structure 242 is located on and extends along a surface of the through via 241. The through via structure 242 extends through the substrates 202, 212 and 222 to physically and electrically couple the conductive layers 204, 224 and 226. The through via structure 244 is located on and extends along a surface of the through via 243. The through via structure 244 extends through the substrates 202, 212 and 222 to physically and electrically couple the conductive layers 204 and 226. The through via structures 242 and 244 include conductive materials. The conductive materials comprise a metal (e.g., copper, titanium, tungsten, aluminum, alloys thereof, combinations thereof, or the like) and may be formed by plating (e.g., electroplating or electroless plating, or the like). In some embodiments, the material of the through via structures 242 and 244 is same as the material of the patterned conductive film 204a.

In some embodiments, an upper surface of the through via structure 242 or 244 is substantially coplanar with an upper surface of the conductive film 226a. Alternatively or additionally, a bottom surface of the through via structure 242 or 244 is substantially coplanar with a bottom surface of the patterned conductive film 204a. In some alternative embodiments, the upper surface of the through via structure 242 or 244 is substantially coplanar with an upper surface of the conductive film 226b. Alternatively or additionally, the bottom surface of the through via structure 242 or 244 is substantially coplanar with a bottom surface of the conductive film 204b.

In some embodiments, the through via structures 242 and 244 have a hollow shape. In other words, the through via structures 242 and 244 respectively have an inner surface exposed to an environment. A via hole dimension D5 of the via structure 242 (or 244) may be less than or substantially equal to 0.2 mm. A ratio of a depth D6 of the via structure 242 (or 244) to the via hole dimension D5 is selected such that the resulting package component 200 can meet the requirements of high-frequency applications. In some embodiments, the ratio of the depth D6 to the via hole dimension D5 is substantially in a range from about 2 to about 8.

Still referring to FIG. 2K, one or more via openings 227 may be formed in the substrate 222. The via opening 227 may be formed using any suitable techniques of forming an opening in the substrate 222. Additionally, one or more via structures 228 may be formed in the via openings 227. The via structure 228 is located on and extends along a surface of the via opening 227. The via structure 228 extends through the substrate 222 to physically and electrically couple the conductive layers 224 and 226. The via structure 228 includes a conductive material. The conductive material comprises a metal (e.g., copper, titanium, tungsten, aluminum, alloys thereof, combinations thereof, or the like) and may be formed by plating (e.g., electroplating or electroless plating, or the like). In some embodiments, the material of the via structure 228 is same as the material of the patterned conductive film 224a or the conductive film 226a.

A package component 200 is thus formed. The proposed method for forming the package component 200 provides advantages. The proposed method for forming the package component 200 includes forming a conductive layer including a conductive film having a lower resistance over another conductive film having a higher resistance. The conductive film with the lower resistance may provide enhancement of electrical and thermal conductivity. Accordingly, transmission loss in the package component may be reduced, and better conduction of the package component in high-frequency applications may be achieved.

The package component 200 includes three substrates 202, 212, and 222 and six conductive layers 204, 206, 214, 216, 224 and 226. The package components of the present disclosure are not limited to the above-mentioned embodiments and may have other different embodiments. A number of the conductive layers in the package component 200 is selected such that the resulting package component 200 can meet requirements of high-frequency applications. In some embodiments, the number of the conductive layers in the package component 200 is in a range from 4 to 14.

The structures of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

Figure 3A:
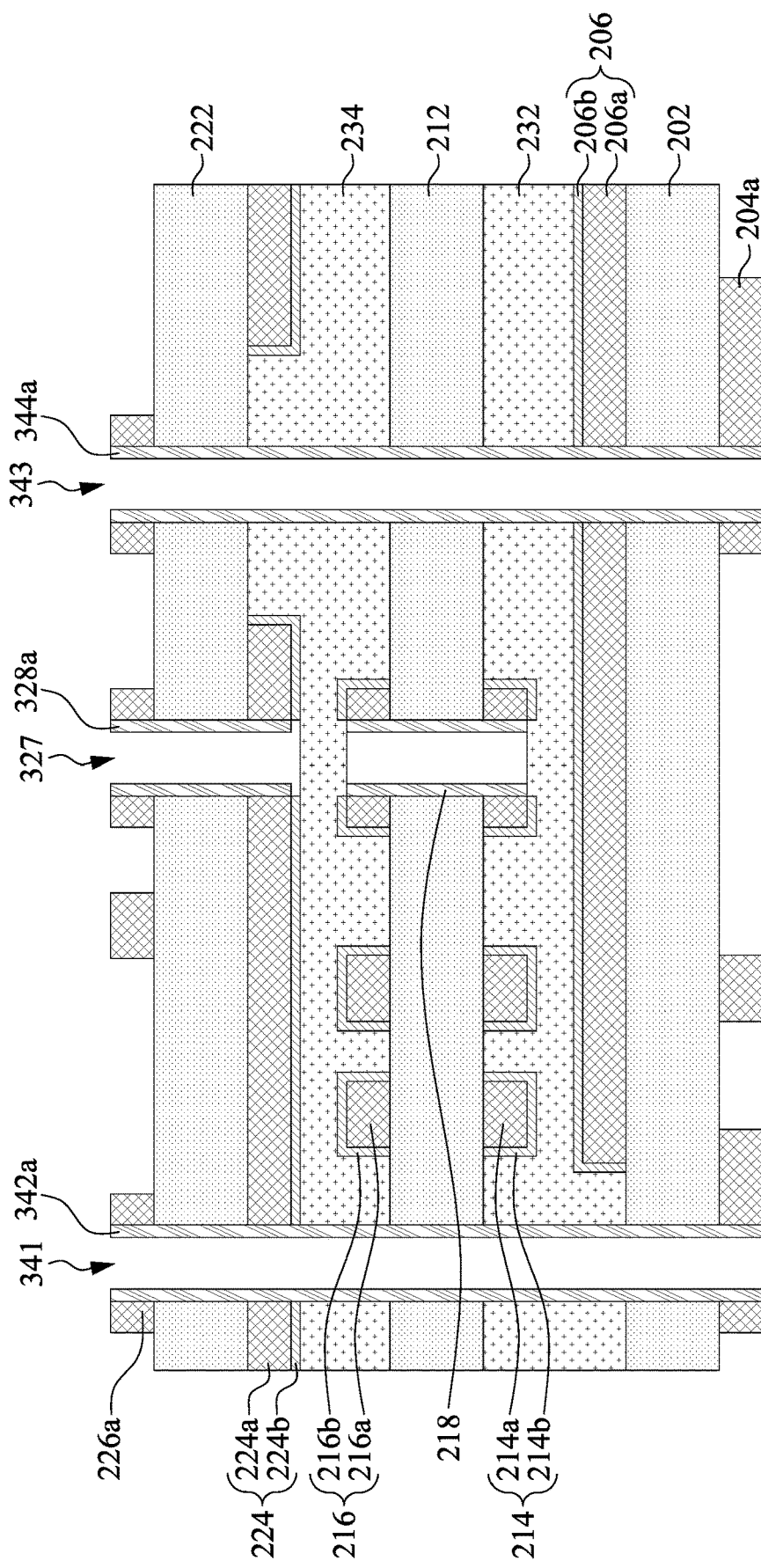
FIGS. 3A to 3B are cross-sectional views illustrating a package component at different fabrication stages constructed according to aspects of one or more embodiments of the present disclosure.
Figure 3B:
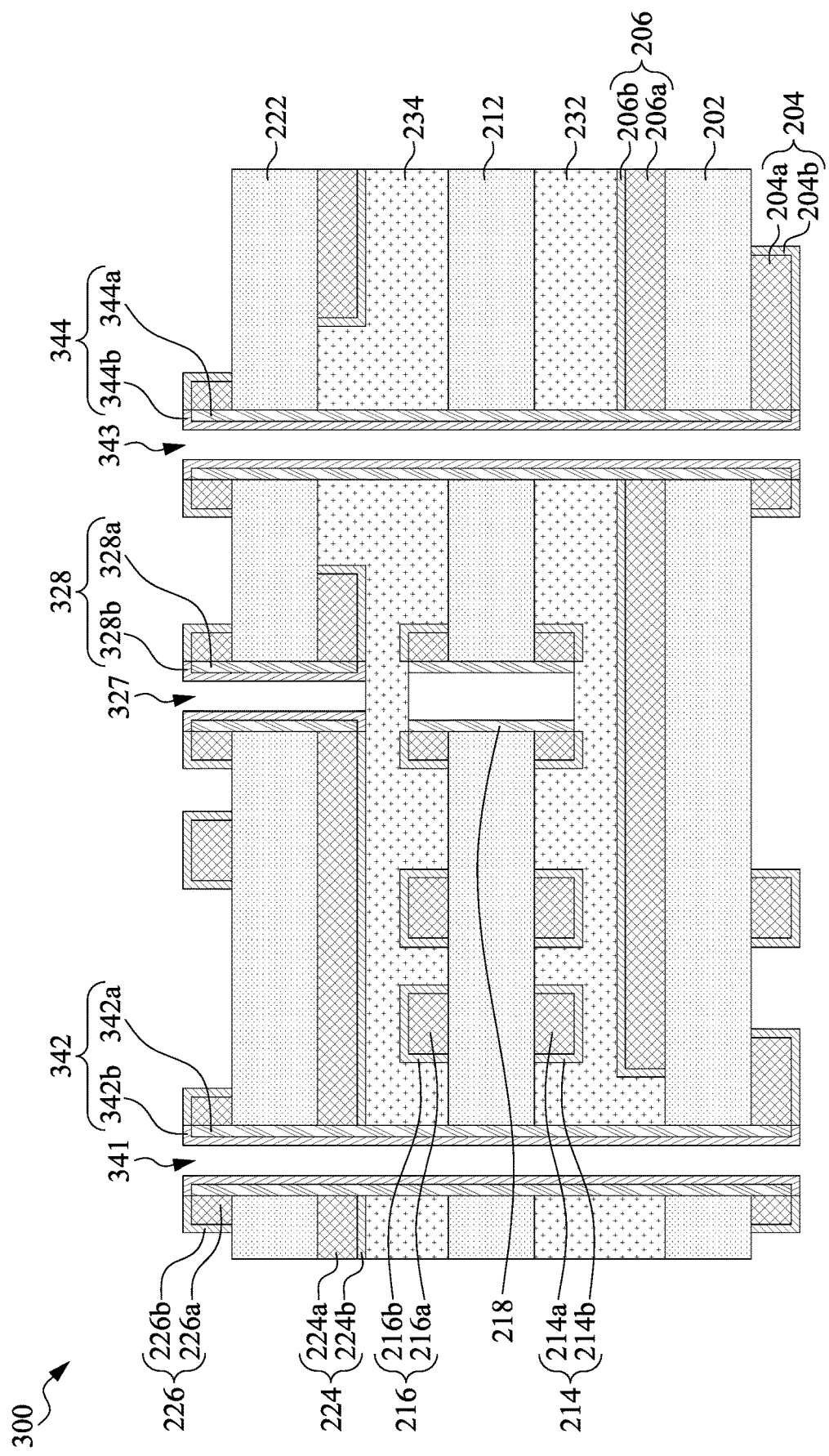

FIGS. 3A to 3B are cross-sectional views illustrating a package component 300 at different fabrication stages constructed according to aspects of one or more embodiments of the present disclosure. FIGS. 3A to 3B illustrate an alternative approach to obtaining via structures.

Referring to FIG. 3A, subsequent to the operations described with reference to FIG. 2I, one or more through vias 341 and 343 and one or more via openings 327 may be formed. Additionally, one or more conductive films 342a, 344a and 328a may respectively be formed in the through vias 341 and 343 and the via openings 327. In some embodiments, a material of the conductive films 342a, 344a and 328a is same as the material of the conductive film 226a.

Referring to FIG. 3B, a conductive film 204b is deposited over the patterned conductive film 204a to form a conductive layer 204, and a conductive film 226b is deposited over the conductive film 226a to form a conductive layer 226. Additionally, one or more conductive films 342b, 344b and 328b are selectively deposited over the conductive films 342a, 344a and 328a to form through via structures 342 and 344 and a via structure 328. In some embodiments, a resistance of the conductive films 342b, 344b and 328b is lower than a resistance of the conductive films 342a, 344a and 328a, In some embodiments, a material of the conductive films 342b, 344b and 328b is same as the material of the conductive film 206b. The conductive films 342b, 344b and 328b may be formed using any suitable conductive materials and any suitable deposition processes that are suitable for forming the conductive film 206h, as set forth above.

In some embodiments, an exposed surface of the conductive film 342a, 344a or 328a may be entirely covered by the conductive film 342b, 344b or 328b. In other words, both upper surfaces and sidewall surfaces of the conductive film 342a, 344a or 328a are covered by the conductive film 342b, 344b or 328b. In some embodiments, a coverage ratio of the conductive film 342h, 344b or 328b over the conductive film 342a, 344a or 328a is substantially in a range from about 50% to about 100%. In some embodiments, the conductive film 342b, 344b or 328b partially covers the conductive film 342a, 344a or 328a, respectively. In other words, some portions of the conductive film 342a, 344a or 328a may remain exposed and are not covered by the conductive film 342b, 344b or 328b.

In some embodiments, the conductive film 342b, 344b or 328b is substantially conformal with respect to a profile of the conductive film 342a, 344a or 328a. In some embodiments, the conductive film 342a, 344a or 328a has a roughed surface similar to the roughed surface 206s (see FIG. 2D) of the patterned conductive film 206a. In some embodiments, a surface roughness of the through via structure 342 or 344 is substantially equal to a surface roughness of the conductive film 342a or 344a. Alternatively or additionally, a surface roughness of the via structure 328 is substantially equal to a surface roughness of the conductive film 328a. In some embodiments, the conductive film 342b or 344b is separated from the conductive layers 204, 224 or 226 by the conductive film 342a or 344a.

In some embodiments, the through via structures 342 and 344 have a hollow shape. In other words, the through via structures 342 and 344 respectively have an inner surface exposed to an environment. In some embodiments, the conductive film 342b (or 344b) having the lower resistance is disposed close to the inner surface, while the conductive film 342a (or 344a) is disposed distal to the inner surface. The via structure 328 may have a hollow shape. In other words, the via structure 328 has an inner surface exposed to an environment. In some embodiments, the conductive film 328b having the lower resistance is disposed close to the inner surface, while the conductive film 328a is disposed distal to the inner surface.

Figure 4:
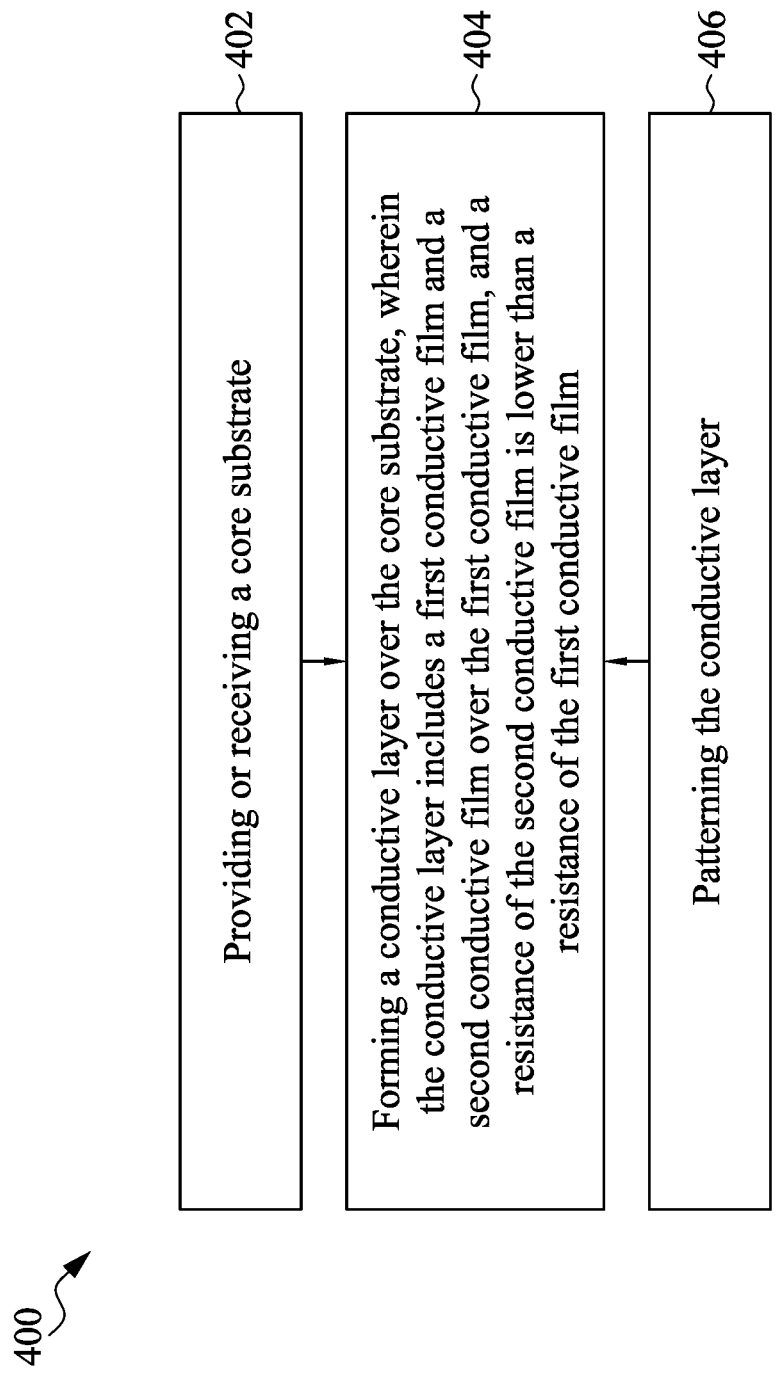
FIG. 4 is a flowchart representing a method for forming a package component according to aspects of one or more embodiments of the present disclosure.

A package component 300 is thus formed. The proposed method for forming the package component 300 provides advantages. The proposed method for forming the package component 300 includes forming a through via structure (or a via structure) including a conductive film having a lower resistance over another conductive film having a higher resistance. The conductive film with the lower resistance may provide enhancement of electrical and thermal conductivity. Accordingly, transmission loss in the package component may be reduced, and better conduction of the package component in high-frequency applications may be achieved, FIG. 4 is a flowchart representing a method 400 for forming a package component according to aspects of one or more embodiments of the present disclosure. The method 400 for forming the package component includes an operation 402, in which a substrate is provided or received. The method 400 further includes an operation 404, in which a conductive layer is formed over the substrate. In some embodiments, the conductive layer includes a first conductive film and a second conductive film. In some embodiments, a resistance of the second conductive film is lower than a resistance of the first conductive film. The method 400 further includes an operation 406, in which the conductive layer is patterned.

The method is described for a purpose of illustrating concepts of the present disclosure and the description is not intended to limit the present disclosure beyond what is explicitly recited in the claims. Additional operations can be provided before, during, and after the method described above and illustrated in FIG. 4, and sonic operations described can be replaced, eliminated, or moved around for additional embodiments of the method.

FIGS. 5A to 5I) are cross-sectional views illustrating a package component 500 at different fabrication stages constructed according to aspects of one or more embodiments of the present disclosure.

Figure 5A:
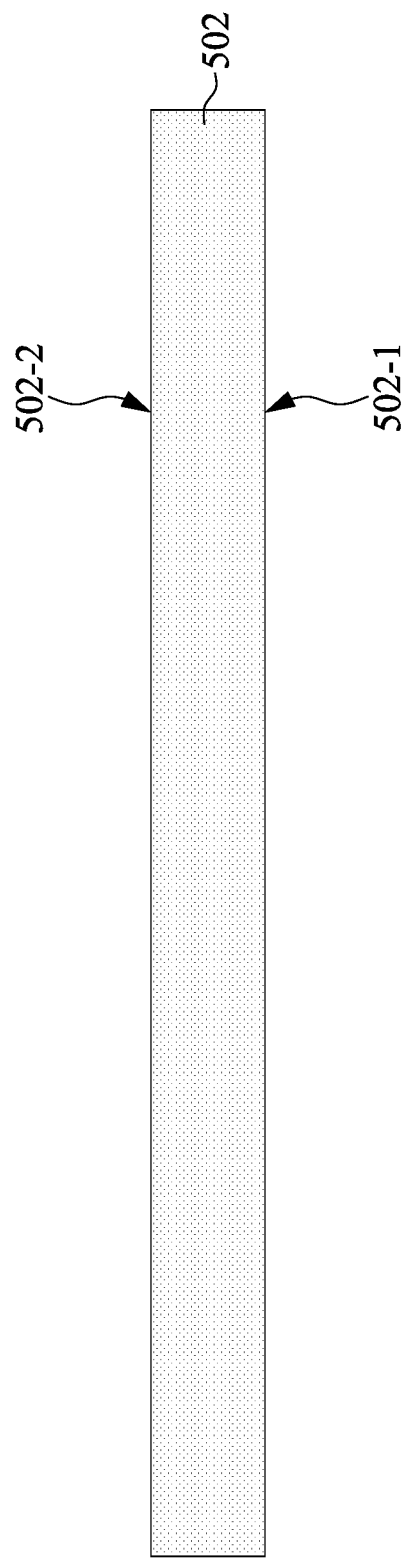

Referring to FIG. 5A, a substrate 502 is provided or received. The respective step is shown as operation 402 of the method 400 in FIG. 4. The substrate 502 may be an insulating core and may include one or more layers of insulating materials. The substrate 502 may be formed using any suitable insulating materials that are suitable for forming the substrate 202, as set forth above. The substrate 502 has a first surface 502-1 and a second surface 502-2 opposite to the first surface.

Figure 5B:
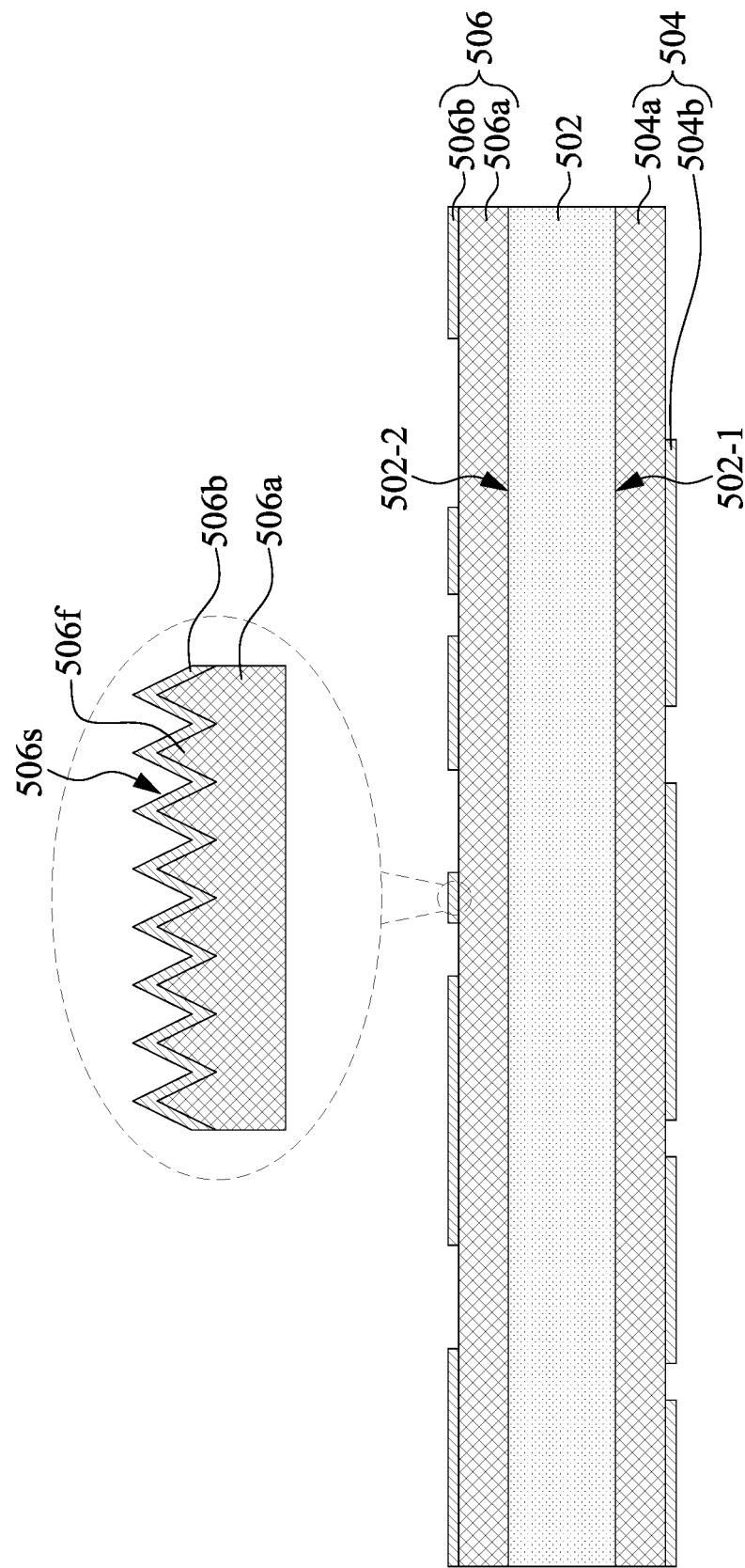

Referring to FIG. 5B, FIG. 5B illustrates the formation of one or more conductive layers 504 and 506 over the substrate 502. The respective step is shown as operation 404 of the method 400 in FIG. 4. The conductive layers 504 and 506 may be formed onto opposing sides of the substrate 502. For example, the conductive layer 504 is disposed over the first surface 502-1, while the conductive layer 506 is disposed over the second surface 502-2.

The conductive layer 504 includes a conductive film 504a and a conductive film 504b. The conductive film 504a directly contacts the first surface 502-1, while the conductive film 504b is separated from the first surface 502-1 by the conductive film 504a. The conductive layer 506 includes a conductive film 506a, and a conductive film 506b. The conductive film 506a directly contacts the second surface 502-2, while the conductive film 506b is separated from the second surface 502-2 by the conductive film 506a. In some embodiments, a resistance of the conductive film 504b or 506b is lower than a resistance of the conductive film 504a or 506a.

The conductive films 504a/506a and 504b/506b may include any suitable conductive materials that are suitable for the conductive films 204a/204b or 206a/206b, as set forth above, For example, a material of the conductive film 504b (or 506b) may be graphene. A number of layers of the graphene is selected such that the resulting package component 500 can meet requirements of enhancement of electrical and thermal conductivity in high-frequency applications. In some embodiments, the number of the layers of the material of the conductive film 504b (or 506b) is substantially in a range from 1 to 20.

In some embodiments, the conductive films 504b and 506b are respectively formed on the conductive films 504a and 506a by a CVD process. In some alternative embodiments, the conductive films 504b and 506b are respectively formed on the conductive films 504a and 506a, by a roll-to-roll process. For example, the conductive films 504b and 506b may be prepared in an electrochemically exfoliated process and are respectively formed on the conductive films 504a and 506a by a roll-to-roll fabrication process. In some embodiments, a solution of the conductive film 504b or 506b (e.g., a solution comprising electrochemically exfoliated graphene) is prepared, and the solution is added dropwise into a water bath. A roll-sheet of the conductive film 504a or 504b may be immersed in the water bath. Next, the roll-sheet of the conductive film 504a or 504b is slowly pulled out by rotating a roller from the water bath with the conductive film 504b or 504b attached.

In some embodiments, an exposed surface (e.g., an upper surface) of the conductive film 504a or 506a may respectively be entirely covered by the conductive film 504b or 506b. In alternative embodiments, the exposed surface of the conductive film 504a or 506a may respectively be partially covered by the conductive film 504b or 506b. The conductive films 504b or 506b may be partially cladded on the conductive films 504a or 506a, respectively. In other words, the conductive films 504b or 506b may partially cover the upper surface of the conductive films 504a or 506a. In some embodiments, a coverage ratio of the conductive film 504b or 506b over the conductive film 504a or 506a is substantially in a range from about 5% to about 95%. In other words, some portions of the conductive film 504a or 506a may remain exposed and are not covered by the conductive film 504b or 506b.

In some embodiments, the conductive film 504b or 506b is substantially conformal with respect to a profile of the conductive film 504a or 506a, as shown in an enlarged view of a portion of the conductive films 506a and 506b shown in the dotted circle in FIG. 513, The conductive film 506a may include a roughed surface 506s. The conductive film 506a further includes a plurality of fractions 506f forming the roughed surface 506s, The fractions 506f may have configurations similar to those of the fractions 206f, as set forth above. In some embodiments, the fractions 506f are not a designed structure in the manufacturing process, and a dimension of the fractions 506f is smaller than a dimension of the conductive film 506a. In some embodiments, the conductive film 504a may include a roughed surface similar to the roughed surface 506s of the conductive film 506a. In some embodiments, the conductive film 506b is substantially conformal with respect to the roughed surface 506s of the conductive film 506a. In some embodiments, a surface roughness of the conductive layer 506 is substantially equal to a surface roughness of the conductive film 506a.

Figure 5C:
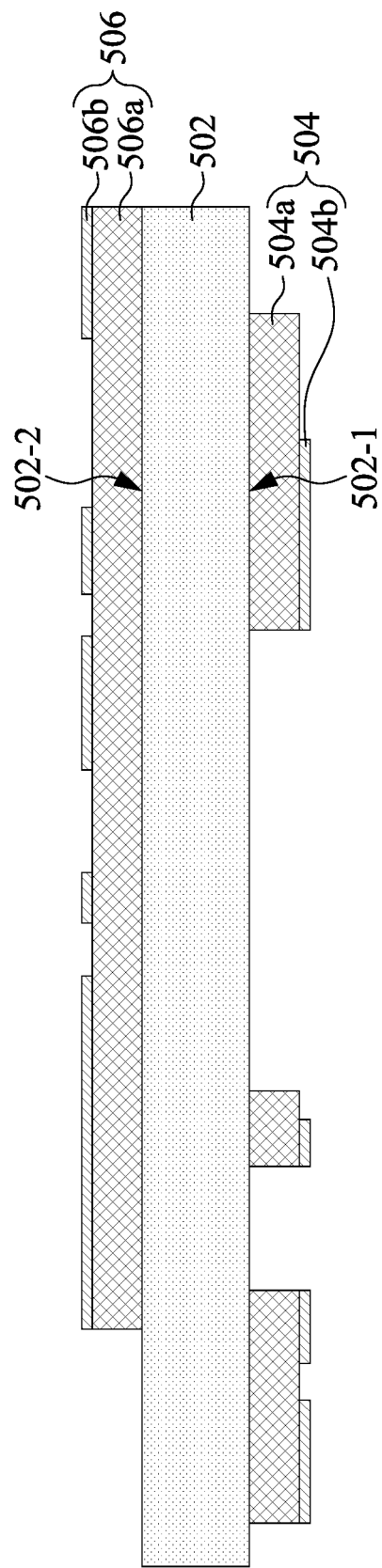

Referring to FIG. 5C, the conductive layers 504 and 506 are patterned. The respective step is shown as operation 406 of the method 400 in FIG. 4. The conductive layers 504 and 506 may be patterned using any suitable lithographic materials (e.g., photoresist) and any suitable lithographic processes (e.g., wet chemical etch, dry etch such as ashing), as set forth above.

Figure 5D:
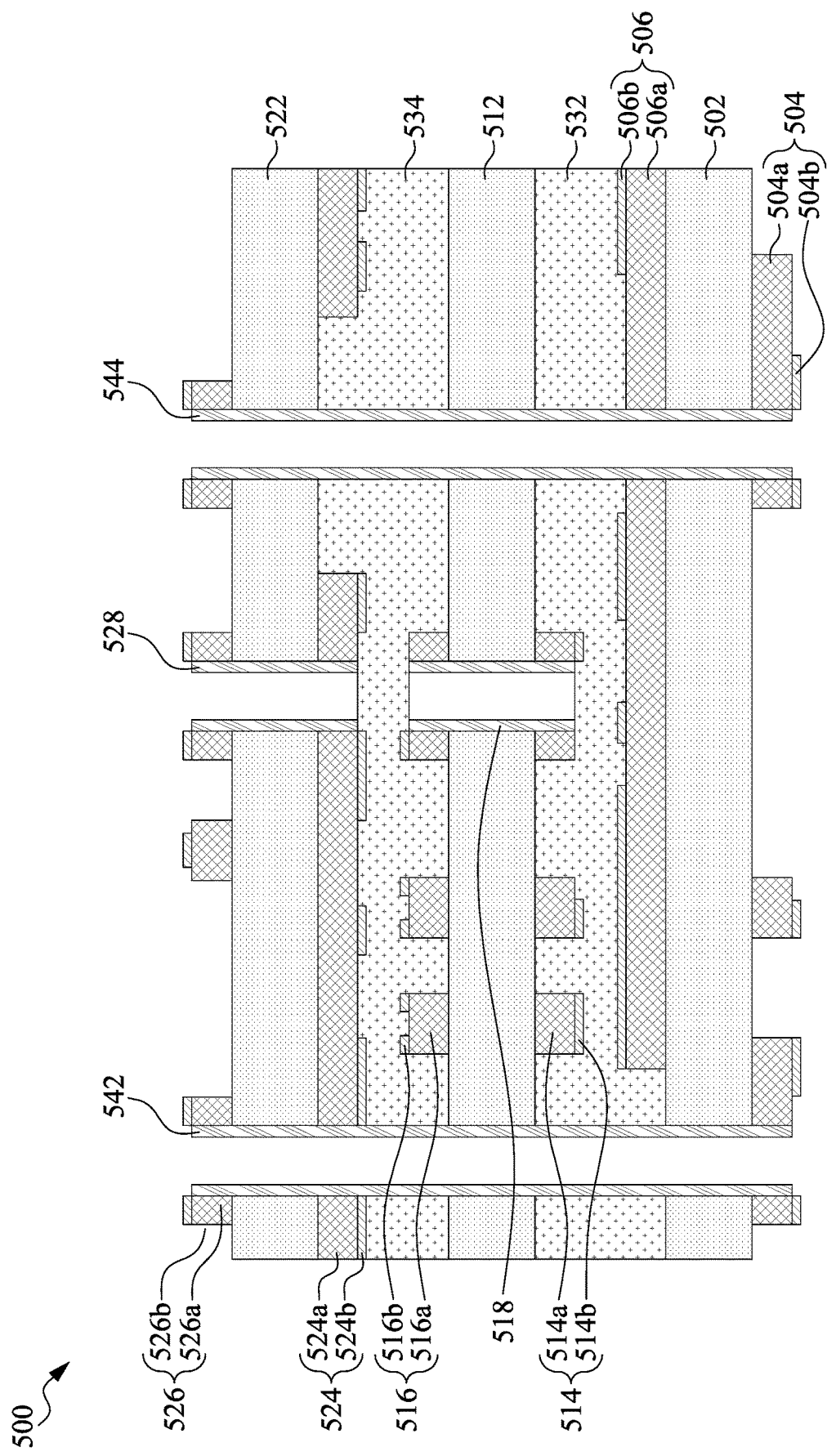

Referring to FIG. 5C, FIG. 5D illustrates a formation of the package component 500. The package component 500 may include the substrate 502 and the conductive layers 504 and 506. The package component 500 may further include a substrate 512, conductive layers 514 and 516, a substrate 522, and conductive layers 524 and 526. Operations similar to those described with reference to FIGS. 5A to 5C can be repeated for forming the substrates 512 and 522 and the conductive layers 514, 516, 524 and 526, In some embodiments, operations similar to those described with reference to FIG. 2F can be repeated for forming a via structure 518 in the substrate 512. The via structure 518 may include any suitable conductive materials that are suitable for forming the via structures 218, as set forth above.

Alternatively or additionally, operations similar to those described with reference to FIGS. 2H to 2I can be repeated for attaching the substrate 512 to the substrate 502 by a dielectric layer 532, and attaching the substrate 522 to the substrate 512 by a dielectric layer 534. The dielectric layers 532 and 534 may include any suitable insulative materials that are suitable for forming the dielectric layer 232 as set forth above. In some embodiments, the dielectric layer 532 surrounds a lateral sidewall of the conductive film 506b or 514b. In some embodiments, the dielectric layer 532 further surrounds a lateral sidewall of the conductive film 506a or 514a.

In some embodiments, operations similar to those described with reference to FIG. 2K can be repeated for forming through via structures 542 and 544 and a via structure 528. The through via structures 542 and 544 and the via structure 528 may include any suitable conductive materials that are suitable for forming the through via structures 242 and 244 and the via structure 228, as set forth above.

The proposed method for forming the package component 500 provides advantages. The proposed method for forming the package component 500 includes forming a conductive layer including a conductive film having a lower resistance over another conductive film having a higher resistance. The conductive film with the lower resistance may provide enhancement of electrical and thermal conductivity. Accordingly, transmission loss in the package component may be reduced, and better conduction of the package component in high-frequency applications may be achieved.

Figure 6:
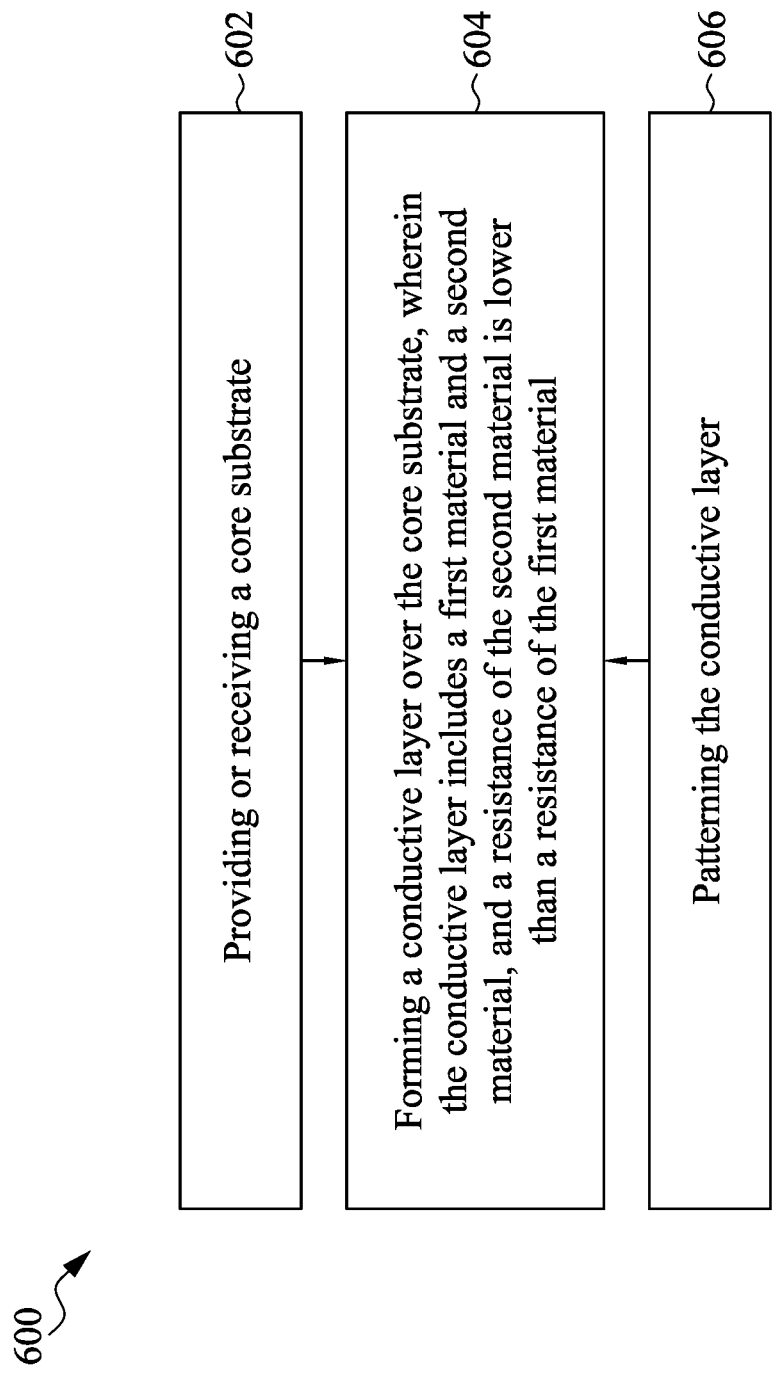
FIG. 6 is a flowchart representing a method for forming a package component according to aspects of one or more embodiments of the present disclosure.

FIG. 6 is a flowchart representing a method 600 for forming a package component according to aspects of one or more embodiments of the present disclosure. The method 600 for forming the package component includes an operation 602, in which a substrate is provided or received. The method 600 further includes an operation 604, in which a conductive layer is formed over the substrate. In some embodiments, the conductive layer includes a first material and a second material. In some embodiments, a resistance of the second material is lower than a resistance of the first material. The method 600 further includes an operation 606, in which the conductive layer is patterned.

The method is described for a purpose of illustrating concepts of the present disclosure and the description is not intended to limit the present disclosure beyond what is explicitly recited in the claims. Additional operations can be provided before, during, and after the method described above and illustrated in FIG. 6, and some operations described can be replaced, eliminated, or moved around for additional embodiments of the method.

Figure 7A:
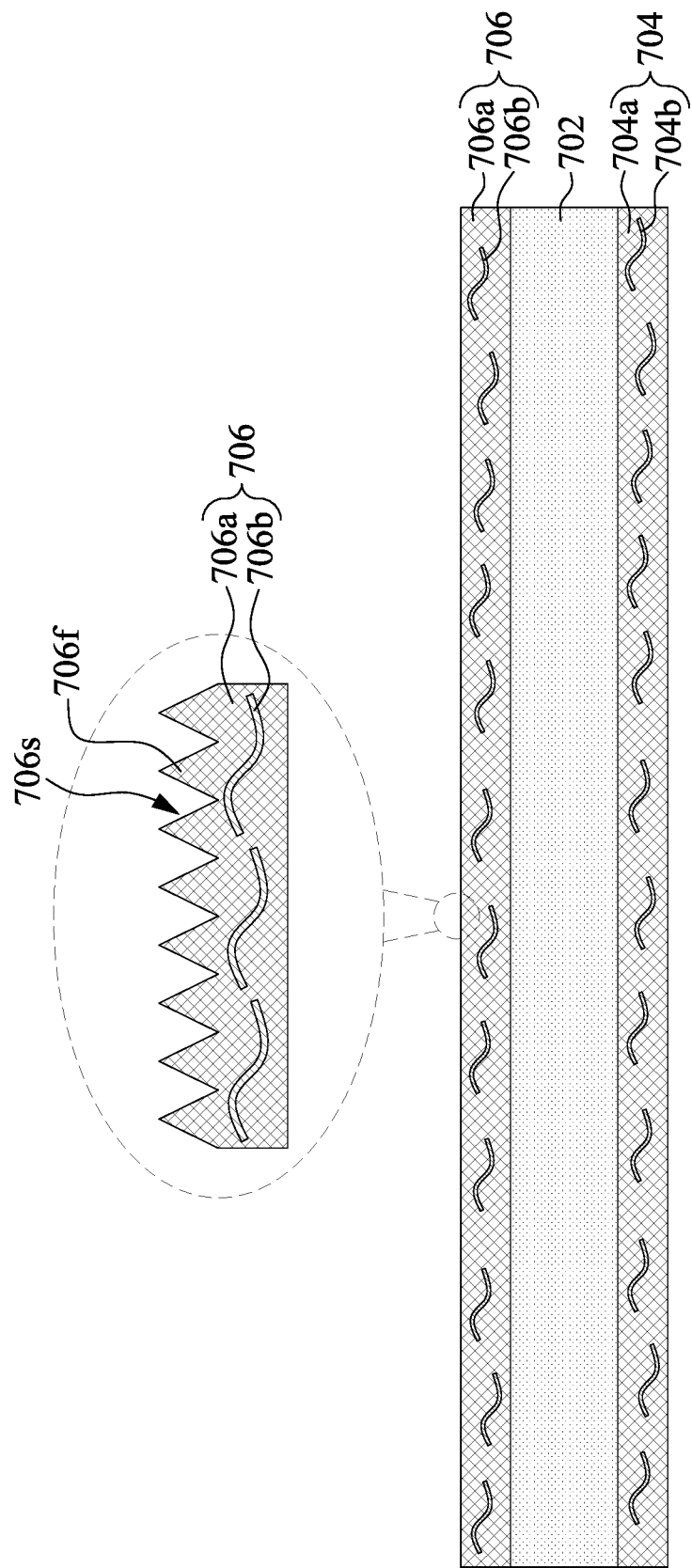
FIGS. 7A to 7C are cross-sectional views illustrating a package component at different fabrication stages constructed according to aspects of one or more embodiments of the present disclosure.
Figure 7B:
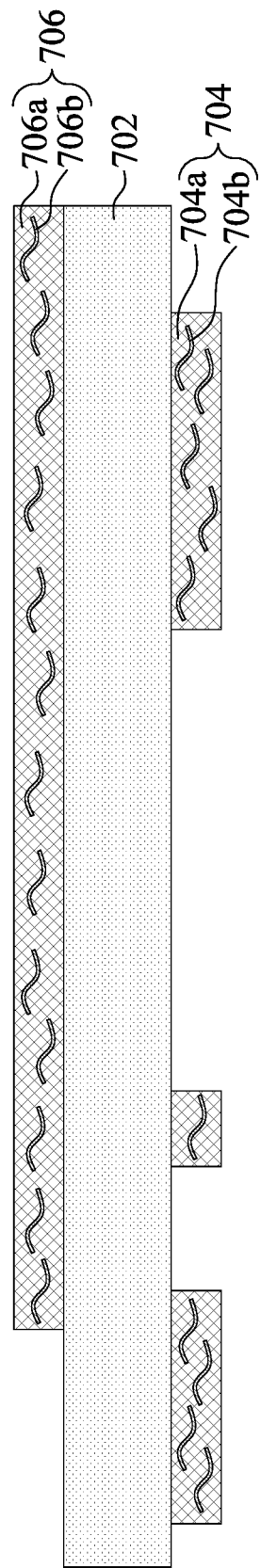
Figure 7C:
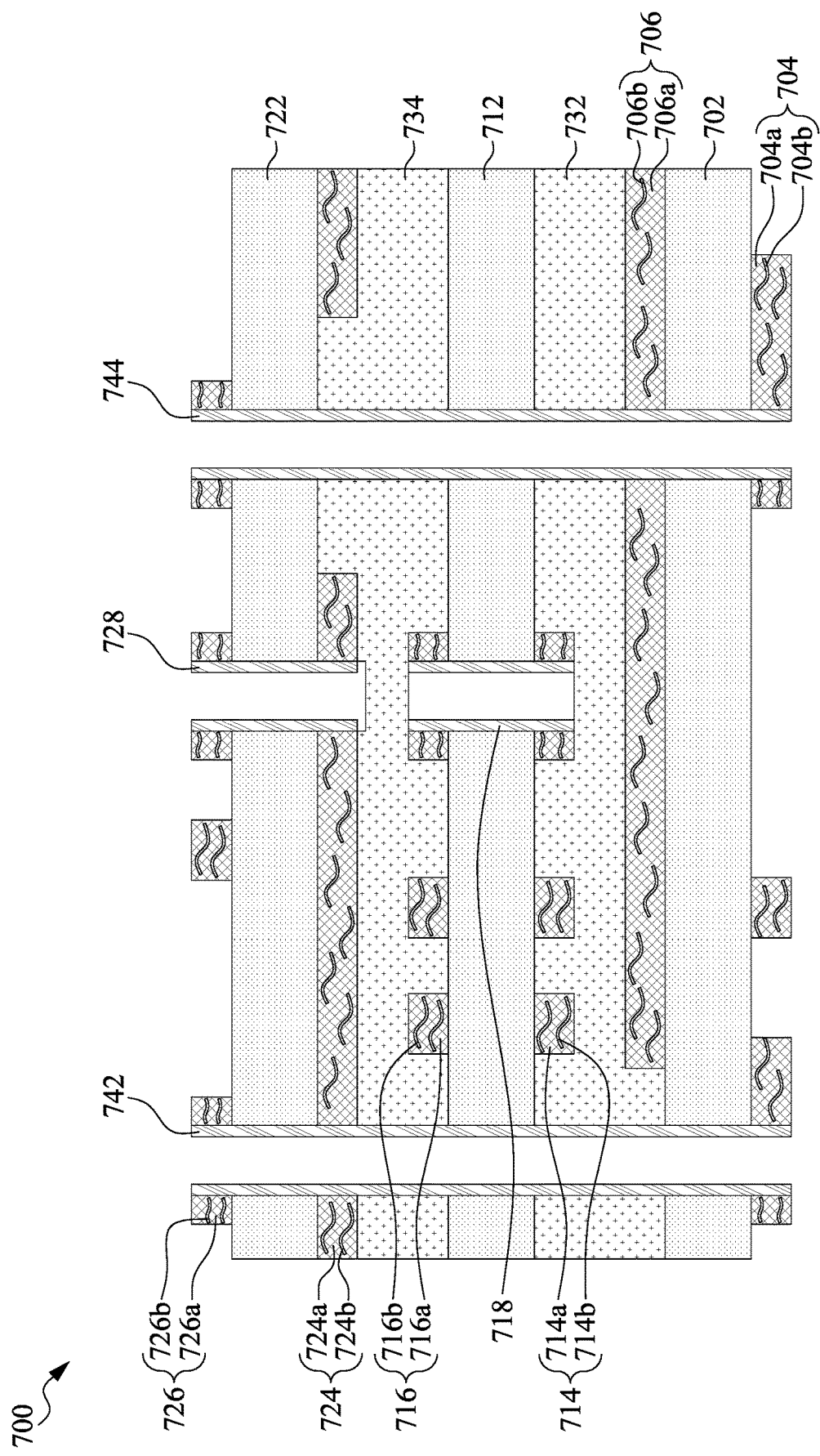

FIGS. 7A to 7C are cross-sectional views illustrating a package component 700 at different fabrication stages constructed according to aspects of one or more embodiments of the present disclosure.

Referring to FIG. 7A, a substrate 702 is provided or received. The respective step is shown as operation 602 of the method 600 in FIG. 6. The substrate 702 may be an insulating core and may include one or more layers of insulating materials. The substrate 702 may be formed using any suitable insulating materials that are suitable for forming the substrate 202, as set forth above.

FIG. 7A further illustrates formation of one or more conductive layers 704 and 706 over the substrate 702. The respective step is shown as operation 604 of the method 600 in FIG. 6. The conductive layers 704 and 706 may be formed onto opposing sides of the substrate 702. The conductive layer 704 includes a conductive film 704a and a conductive film 704b. The conductive layer 706 includes a conductive film 706a and a conductive film 706b. In some embodiments, a resistance of the conductive film 704b or 706b is lower than a resistance of the conductive film 704a or 706a.

In some embodiments, the conductive film 704b (or 706b) may be comprised of microstructures dispersed or inserted in the conductive film 704a (or 706a). The conductive film 704b (or 706b) may also be comprised of flakes dispersed or inserted in the conductive film 704a (or 706a). A dimension of the microstructure (or the flake) is selected such that the resulting package component 700 can meet requirements for enhancement of electrical and thermal conductivity in high-frequency applications. In some embodiments, the dimension of the microstructure (or the flake) is substantially in a range from one-fiftieth of a minimum width of the conductive layer 704 (or 706) to one-half of the minimum width of the conductive layer 704 (or 706).

The conductive films 704a/706a and 704b/706b may include any suitable conductive materials that are suitable for the conductive films 204a/204b or 206a/206b, as set forth above. For example, the material of the conductive film 704b (or 706b) may be graphene. A number of layers of the graphene is selected such that the resulting package component 700 can meet the requirements for the enhancement of electrical and thermal conductivity in high-frequency applications. In some embodiments, the number of the layers of the material of the conductive film 704b (or 706b) is substantially in a range from 1 to 20.

In some embodiments, the conductive layers 704 and 706 are formed by an electrolytic formation process. For example, a solution including the material of the conductive film 704a (or 706a) and the material of the conductive film 704b (or 706b) is prepared. A rotating electrode may be immersed into the solution. Next, a foil of the conductive layer 704 (or 706) is slowly pulled out from the solution with the material of the conductive film 704b (or 706b) dispersed in the material of the conductive film 704a (or 706a), In some embodiments, a volume ratio of the material of the conductive film 704b (or 706b) in the conductive layer 704 (or 706) is substantially in a range from about 0.01% to about 80%. In some embodiments, the solution may be a copper sulfate plating bath including copper ions and graphene flakes. In alternative embodiments, the solution may be a copper sulfate plating bath including copper ions and carbon nanotube fibers.

In some embodiments, the conductive layer 706 has a roughed surface 706s, as shown in an enlarged view of a portion of the conductive layer 706 shown in the dotted circle in FIG. 7A. The conductive layer 706 further includes a plurality of fractions 706f forming the roughed surface 706s. The fractions 706f may have configurations similar to those of the fractions 206f, as set forth above. In some embodiments, the fractions 706f are not a designed structure in the manufacturing process, and a dimension of the fractions 706f is smaller than a dimension of the conductive layer 706. In some embodiments, the material of the conductive film 706b is disposed adjacent to the fractions 706f. In alternative embodiments, the material of the conductive film 706b is at least partially disposed in the fractions 706f. In some embodiments, the material of the conductive film 706b protrudes from the roughed surface 706s. The conductive layer 704 may include a roughed surface similar to the roughed surface 706s of the conductive layer 706.

Referring to FIG. 7B, the conductive layers 704 and 706 are patterned. The respective step is shown as operation 606 of the method 600 in FIG. 6. The conductive layers 704 and 706 may be patterned using any suitable lithographic materials (e.g., photoresist) and any suitable lithographic processes (e.g., wet chemical etch, or dry etch such as ashing), as set forth above, Referring to FIG. 7C, FIG. 7C illustrates a formation of the package component 700. The package component 700 may include the substrate 702 and the conductive layers 704 and 706. The package component 700 may further include a substrate 712, conductive layers 714 and 716, a substrate 722, and conductive layers 724 and 726. Operations similar to those described with reference to FIGS. 7A to 7B can be repeated for forming the substrates 712 and 722 and the conductive layers 714, 716, 724 and 726. In some embodiments, operations similar to those described with reference to FIG. 2F can be repeated for forming a via structure 718 in the substrate 712. The via structure 718 may include any suitable conductive materials that are suitable for forming the via structures 218, as set forth above.

Alternatively or additionally, operations similar to those described with reference to FIGS. 2H to 2I can be repeated for attaching the substrate 712 to the substrate 702 by a dielectric layer 732, and attaching the substrate 722 to the substrate 712 by a dielectric layer 734. The dielectric layers 732 and 734 may include any suitable insulative materials that are suitable for forming the dielectric layer 232, as set forth above.

In some embodiments, operations similar to those described with reference to FIG. 2K can be repeated for forming through via structures 742 and 744 and a via structure 728. The through via structures 742 and 744 and the via structure 728 may include any suitable conductive materials that are suitable for forming the through via structures 242 and 244 and the via structure 228, as set forth above.

The proposed method for forming the package component 700 provides advantages. The proposed method for forming the package component 700 includes forming a conductive layer including materials having different resistances. The material with lower resistance may provide enhancement of electrical and thermal conductivity. Accordingly, transmission loss in the package component may be reduced, and better conduction of the package component in high-frequency applications may be achieved.

In accordance with some embodiments of the present disclosure, a package component is provided. The package component includes a substrate and a first conductive layer. The substrate includes a first surface and a second surface opposite to the first surface. The first conductive layer is disposed over the first surface. The first conductive layer includes a first conductive feature and a second conductive feature. The second conductive feature covers a portion of the first conductive feature. A resistance of the second conductive feature is lower than a resistance of the first conductive feature.

In accordance with some embodiments of the present disclosure, a package component is provided. The package component includes a first substrate, a first conductive layer, a second substrate and an encapsulant. The first substrate has a first surface and a second surface opposite to the first surface. The first conductive layer is disposed over the second surface of the first substrate. The first conductive layer comprises a first conductive feature and a second conductive feature over the first conductive feature. A resistance of the first conductive feature is greater than a resistance of the second conductive feature. The second substrate is disposed over the second surface of the first substrate. The second substrate has a third surface and a fourth surface opposite to the third surface, and the third surface faces the second surface. The encapsulant is disposed between the first substrate and the second substrate. The encapsulant surrounds a lateral sidewall of the second conductive feature.

In accordance with some embodiments of the present disclosure, a method of forming a package component is provided. The method includes following operations. A substrate is provided or received. A first patterned conductive film is formed over the substrate. A second conductive film is selectively deposited over the first patterned conductive film to form a conductive layer comprising the first patterned conductive film and the second conductive film. A resistance of the second conductive film is lower than a resistance of the first patterned conductive film.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package component, comprising:
   a substrate comprising a first surface and a second surface opposite to the first surface; and
   a first conductive layer over the first surface, the first conductive layer comprising:
      a first conductive feature; and
      a second conductive feature over the first conductive feature, wherein the second conductive feature covers a portion of the first conductive feature, and a resistance of the second conductive feature is lower than a resistance of the first conductive feature wherein a coverage ratio of the second conductive feature over the first conductive feature is substantially in a range from about 5% to about 95%.

2. The package component of claim 1, wherein the first conductive feature directly contacts the first surface, and the second conductive feature is separated from the first surface by the first conductive feature.

3. The package component of claim 1, wherein the second conductive feature entirely covers an upper surface and sidewall surfaces of the first conductive feature.

4. The package component of claim 1, wherein a coverage ratio of the second conductive feature over the first conductive feature is substantially in a range from about 50% to about 100%.

5. The package component of claim 1, wherein the substrate comprises a single-sided or a double-sided copper-clad laminate.

6. The package component of claim 1, further comprising:
   a second conductive layer over the second surface.

7. The package component of claim 6, further comprising:
   a via structure penetrating through the substrate and electrically connecting the second conductive layer to the first conductive layer.

8. The package component of claim 7, wherein the via structure has an inner surface exposed to an environment.

9. The package component of claim 7, wherein the via structure comprises:
   a third conductive feature contacting the first conductive layer and the second conductive layer; and a fourth conductive feature over the third conductive feature, wherein the fourth conductive feature is separated from the second conductive layer and the first conductive layer by the third conductive feature, wherein a resistance of the fourth conductive feature is lower than a resistance of the third conductive feature.

10. A package component, comprising:
a first substrate having a first surface and a second surface opposite to the first surface;
a first conductive layer over the second surface of the first substrate, the first conductive layer comprising a first conductive feature and a second conductive feature over the first conductive feature, wherein a resistance of the first conductive feature is greater than a resistance of the second conductive feature;
a second substrate over the second surface of the first substrate, wherein the second substrate has a third surface and a fourth surface opposite to the third surface, and the third surface faces the second surface; and
an encapsulant disposed between the first substrate and the second substrate, wherein the encapsulant surrounds a lateral sidewall of the second conductive feature.

11. The package component of claim 10, wherein the encapsulant further surrounds a lateral sidewall of the first conductive feature.

12. The package component of claim 10, further comprising:
a second conductive layer over the third surface of the second substrate.

13. The package component of claim 12, further comprising:
a through via structure penetrating through the first substrate and the second substrate, and electrically connecting the first conductive layer to the second conductive layer.

14. The package component of claim 13, wherein a ratio of a depth of the through via structure to a via hole dimension of the through via structure is substantially in a range from about 2 to about 8.

15. The package component of claim 12, further comprising:
a via structure penetrating through the second substrate and electrically connected to the second conductive layer, wherein the via structure is electrically isolated from the first conductive layer.

16. The package component of claim 15, wherein a via hole dimension of the via structure is less than or substantially equal to 0.2 mm.

17. A method for forming a package component, comprising:
providing or receiving a substrate;
forming a first patterned conductive film over the substrate;
selectively depositing a second conductive film over the first patterned conductive film to form a conductive layer comprising the first patterned conductive film and the second conductive film, wherein a resistance of the second conductive film is lower than a resistance of the first patterned conductive film;
forming a through via penetrating through the substrate;
forming a third conductive film in the through via; and
forming a fourth conductive film covering an exposed surface of the third conductive film to form a through via structure comprising the third conductive film and the fourth conductive film, wherein a resistance of the fourth conductive film is lower than a resistance of the third conductive film.

18. The method of claim 17, wherein a surface roughness (Ra) of the conductive layer is substantially equal to a surface roughness of the first patterned conductive film.

19. The method of claim 17, wherein the substrate comprises a single-sided or a double sided copper-clad laminate.

20. The method of claim 17, wherein the through via structure has an inner surface exposed to an environment.

* * * * *